US008017464B2

(12) United States Patent
Sugiyama et al.

(10) Patent No.: US 8,017,464 B2
(45) Date of Patent: Sep. 13, 2011

(54) SEMICONDUCTOR INTEGRATED CIRCUIT DEVICE AND A METHOD FOR MANUFACTURING A SEMICONDUCTOR INTEGRATED CIRCUIT DEVICE

(75) Inventors: Masao Sugiyama, Tokyo (JP); Yoshiyuki Kaneko, Tokyo (JP); Yoshinori Kondo, Tokyo (JP); Masayoshi Hirasawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 119 days.

(21) Appl. No.: 12/558,498

(22) Filed: Sep. 12, 2009

(65) Prior Publication Data
US 2010/0078690 A1 Apr. 1, 2010

(30) Foreign Application Priority Data

Sep. 29, 2008 (JP) ................................. 2008-249416

(51) Int. Cl.
*H01L 21/336* (2006.01)
*H01L 21/8234* (2006.01)
(52) U.S. Cl. ........ 438/197; 438/664; 438/683; 438/692; 438/699; 438/745; 257/E21.244
(58) Field of Classification Search ........................ None
See application file for complete search history.

(56) References Cited

U.S. PATENT DOCUMENTS 5,532,191 A * 7/1996 Nakano et al. ................ 438/692
7,348,230 B2 * 3/2008 Matsuo et al. ................ 438/197

FOREIGN PATENT DOCUMENTS

| JP | 3-194932 A | 8/1991 |
| JP | 5-21620 A | 1/1993 |
| JP | 5-206474 A | 8/1993 |
| JP | 7-147281 A | 6/1995 |
| JP | 7-221179 A | 8/1995 |
| JP | 2000-208624 A | 7/2000 |
| JP | 2002-110666 A | 4/2002 |

* cited by examiner

*Primary Examiner* — Zandra Smith
*Assistant Examiner* — Khanh B Duong
(74) *Attorney, Agent, or Firm* — Miles & Stockbridge P.C.

(57) ABSTRACT

As a method for constituting a pre-metal interlayer insulating film, such method is considered as forming a CVD silicon oxide-based insulating film having good filling properties of a silicon oxide film by ozone TEOS, reflowing the film at high temperatures to planarize it, then stacking a silicon oxide film having good CMP scratch resistance by plasma TEOS, and, further, planarizing it by CMP. However, it was made clear that, in a process for forming a contact hole, crack in the pre-metal interlayer insulating film is exposed in the contact hole, into which barrier metal intrudes to cause short-circuit defects.
In the present invention, in the pre-metal process, after forming the ozone TEOS film over an etch stop film, the ozone TEOS film is once etched back so as to expose the etch stop film over a gate structure, and, after that, a plasma TEOS film is formed over the remaining ozone TEOS film, and then the plasma TEOS film is planarized by CMP.

24 Claims, 18 Drawing Sheets

SEMICONDUCTOR INTEGRATED CIRCUIT DEVICE AND A METHOD FOR MANUFACTURING A SEMICONDUCTOR INTEGRATED CIRCUIT DEVICE

CROSS REFERENCE TO RELATED APPLICATIONS

The disclosure of Japanese Patent Application No. 2008-249416 filed on Sep. 29, 2008 including the specification, drawings and abstract is incorporated herein by reference in its entirety.

BACKGROUND OF THE INVENTION

The present invention relates to a semiconductor integrated circuit device formed by mainly integrating MISFETs (Metal Insulator Semiconductor Field Effect Transistor) or MOS-FETs (Metal Oxide Semiconductor Field Effect Transistor), and to a technology that is effective when applied to a technology for forming an insulating film, in particular, to a technology for forming a pre-metal interlayer insulating film, in a method of manufacturing the semiconductor integrated circuit device (or a semiconductor device).

Japanese patent laid-open No. 5-21620 discloses a technology in which a SOG (Spin-On-Glass) silicon oxide film is coated over a TEOS (Tetra-Ethyl-Ortho-Silicate)-CVD (Chemical Vapor Deposition) silicon oxide film using TEOS to be planarized and these are etched back by dry etching, as a technology for forming a pre-metal interlayer insulating film.

Japanese patent laid-open No. 5-206474 discloses a technology in which a TEOS-CVD silicon oxide film using TEOS is reflowed for planarization and then etched back.

Japanese patent laid-open No. 2002-110666 discloses a technology in which a CVD silicon oxide film by P-TEOS (Plasma-TEOS) is formed over a CVD silicon oxide film by HDP (High Density Plasma), and the CVD silicon oxide film by P-TEOS is subjected to CMP (Chemical Mechanical Polishing) or to etching back for planarization, and then, a CVD silicon oxide film by P-TEOS is formed as a cap film.

Japanese patent laid-open No. 2000-208624 discloses, as a technology for forming a pre-metal interlayer insulating film, a technology for forming a silicon oxide film by a plasma CVD method using $O_3$-TEOS, then, polishing the silicon oxide film by a CMP method until the conductive layer of the gate electrode is exposed, and further forming a silicon oxide film on it by a CVD method using $PH_3$—$SiH_4$—$O_2$.

Japanese patent laid-open Nos. 7-147281 and 3-194932 disclose a technology for forming a silicon oxide film between wirings by CVD using $O_3$-TEOS, then removing the silicon oxide film by etching back or CMP until the upper portion of the wiring is exposed, and further forming a silicon oxide film on it by plasma CVD using TEOS.

Japanese patent laid-open No. 7-221179 discloses a technology for filling an area between wirings with an $O_3$-TEOS NSG silicon film (which generates in-situ reflow at the deposition), then forming a silicon oxide film by plasma CVD, and then planarizing it by CMP.

SUMMARY OF THE INVENTION

As a method for constituting a pre-metal interlayer insulating film of a semiconductor integrated circuit device, it is considered that a CVD silicon oxide-based insulating film having good filling properties of a silicon oxide film by ozone TEOS (hereinafter, it is abbreviated as an "ozone TEOS film" or an "$O_3$-TEOS film" when there might be no confusion) is formed, then a silicon oxide film having good CMP scratch resistance (hereinafter, it is abbreviated as an "plasma TEOS film" or an "P-TEOS film" when there might be no confusion) or the like is stacked by plasma TEOS, and further the product is planarized by CMP. Further, the application of a CVD silicon oxide film by HDP having good filling properties is also considered in place of the silicon oxide film by ozone TEOS and in place of the silicon oxide film by plasma TEOS and the like.

However, as the investigation result of inventors of the present application, it was made clear that, in the former case, in a process for forming a contact hole, cracks in the pre-metal interlayer insulating film once blocked by a cap insulating film are exposed within the contact hole, into which barrier metal intrudes to cause short-circuit defects. The crack is caused by stress concentration due to CMP to the plasma TEOS film on the ozone TEOS film being a relatively soft foundation, when the plasma TEOS film becomes thin at the upper portion of a gate structure. The inventors of the application made it clear that this is a problem that becomes remarkable along with the lowering of temperature for forming the ozone TEOS film.

On the other hand, for the latter case, adverse affect to transistor properties due to stress in the film is concerned, and, in addition, there is such a problem that a silicon-rich and hardly etchable film is generated at the initial stage of forming the film.

Meanwhile, Japanese patent laid-open Nos. 5-21620, 7-147281 and 3-194932 do not consider the lowering of the film strength caused by a low temperature formation of the TEOS-CVD film, Japanese patent laid-open Nos. 5-206474 and 7-221179 also do not consider the lowering of the film strength caused by a low temperature process because the TEOS-CVD film has been subjected to a reflow treatment, and Japanese patent laid-open Nos. 2002-110666 and 2000-208624 also do not consider the lowering of the film strength caused by a low temperature film formation because a plasma-treated oxide film is used.

The invention of the application has been achieved for solving these problems.

A purpose of the present invention is to provide a process for manufacturing a semiconductor integrated circuit device with high reliability.

The other purposes and the new feature of the present invention will become clear from the description of the present specification and the accompanying drawings.

The following explains briefly the outline of a typical invention among the inventions disclosed in the present application.

Namely, in the invention of the application, after forming the ozone TEOS film over an etch stop film in a pre-metal process, the ozone TEOS film is once etched back so that the etch stop film over the gate structure is exposed, and then the plasma TEOS film is formed over the remaining ozone TEOS film, and the plasma TEOS film is planarized by CMP.

The following explains briefly the effect acquired by the typical invention among the inventions disclosed in the present application.

Namely, it is possible to avoid the CMP stress concentration, in the pre-metal process, by forming the ozone TEOS film over the etch stop film, then once etching back the ozone TEOS film so that the etch stop film over the gate structure is exposed, then forming the plasma TEOS film over the remaining ozone TEOS film, subjecting the plasma TEOS film to CMP to planarize it, and thereby converting the foundation of the plasma TEOS film at the upper portion of the gate structure to a relatively hard etch stop film. Namely, it is possible to improve the mechanical strength of the upper portion of the gate structure upon which stress concentrates in the grinding direction of CMP (the direction parallel to the main surface of the Si substrate).

DETAILED DESCRIPTION OF THE PREFERRED EMBODIMENTS

Outline of Embodiment

Figure 1:
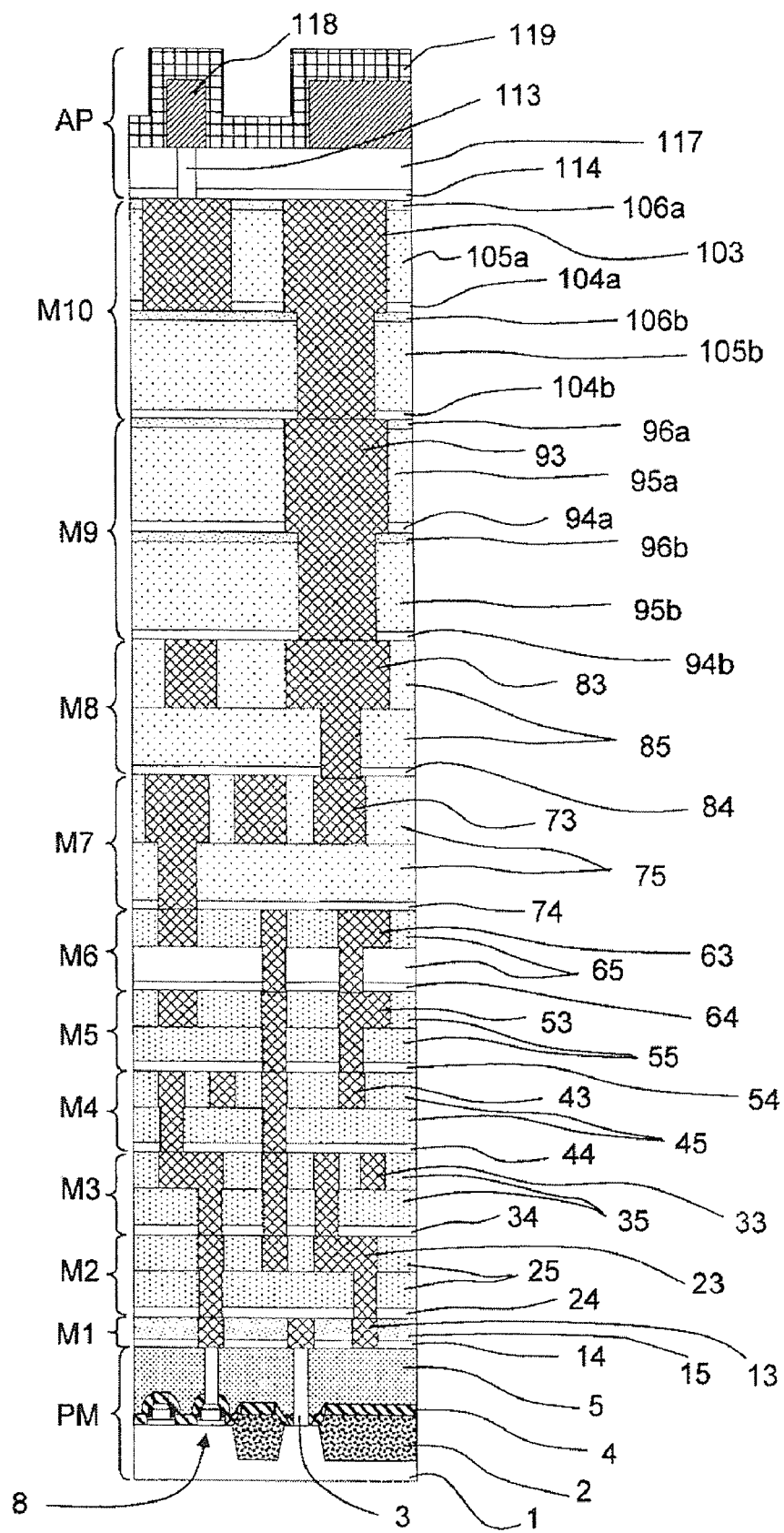
FIG. 1 is a device cross-sectional view showing one example of a cross-sectional structure of the device according to a method of manufacturing a semiconductor integrated circuit device of one embodiment of the present invention.

Firstly, the outline will be described about representative embodiments of the invention disclosed in the application.

1. A method of manufacturing a semiconductor integrated circuit device comprises the steps of:

(a) forming a plurality of MISFET gate structures including a polysilicon gate electrode over a first main surface of a semiconductor wafer;

(b) forming a source/drain region near both sides of respective gate structures of the first main surface of the semiconductor wafer;

(c) after the steps of (a) and (b), siliciding the upper surface of the polysilicon gate electrode and the upper surface of the source/drain region;

(d) forming an etch stop film over the approximately whole surface of the first main surface of the semiconductor wafer including the silicided upper surface of the polysilicon gate electrode and the upper surface of the source/drain region;

(e) forming a first silicon oxide film, which is a part of a pre-metal interlayer insulating film, by thermal CVD using ozone and TEOS over the etch stop film;

(f) etching the first silicon oxide film to expose the etch stop film over the respective gate structures;

(g) after the step (f), forming a second silicon oxide film, which is a part of the pre-metal interlayer insulating film, by plasma CVD using TEOS at a portion where the etch stop film is exposed and a portion where the first CVD silicon oxide film remains; and (h) performing a first chemical mechanical polishing treatment for the upper surface of the second silicon oxide film.

2. The method of manufacturing a semiconductor integrated circuit device according to the paragraph 1, further comprises the step of:

(i) after the step (h), forming a third silicon oxide film, which is a part of the pre-metal interlayer insulating film, over the second silicon oxide film.

3. The method of manufacturing a semiconductor integrated circuit device according to the paragraph 1 or 2, further comprises the steps of:

(j) after the step (h), opening a contact hole at the pre-metal interlayer insulating film, by dry etching utilizing the etch stop film; and (k) after the step (j), removing the etch stop film at the bottom of the contact hole.

4. The method of manufacturing a semiconductor integrated circuit device according to the paragraph 1 or 2, further comprises the steps of:

(j) after the step (h), opening a contact hole at the pre-metal interlayer insulating film, by dry etching utilizing the etch stop film;

(k) after the step (j), removing the etch stop film at the bottom of the contact hole to extend the contact hole;

(l) after the step (k), forming a barrier metal film at the inner surface of the contact hole and the upper surface of the pre-metal interlayer insulating film;

(m) after the step (l), forming a metal member layer containing tungsten as a main component over the barrier metal film so as to fill the contact hole; and (n) after the step (m), performing a second chemical mechanical polishing treatment to remove the metal member layer and the barrier metal film outside the contact hole.

5. The method of manufacturing a semiconductor integrated circuit device according to the paragraph 5, further comprises the steps of:

(i) after the step (h), forming a third silicon oxide film, which is a part of the pre-metal interlayer insulating film, over the second silicon oxide film;

(j) after the step (i), opening a contact hole at the pre-metal interlayer insulating film, by dry etching utilizing the etch stop film;

(k) after the step (j), removing the etch stop film at the bottom of the contact hole to extend the contact hole;

(l) after the step (k), forming a barrier metal film at the inner surface of the contact hole and the upper surface of the pre-metal interlayer insulating film;

(m) after the step (l), forming a metal member layer containing tungsten as a main component over the barrier metal film so as to fill the contact hole; and (n) after the step (m), performing a second chemical mechanical polishing treatment to remove the metal member layer and the barrier metal film outside the contact hole.

6. In the method of manufacturing a semiconductor integrated circuit device according to the paragraph 5, the step (n) includes the substeps of:

(n1) performing the second chemical mechanical polishing treatment to remove the metal member layer and the barrier metal film outside the contact hole; and (n2) performing the second chemical mechanical polishing treatment to remove the third silicon oxide film.

7. In the method of manufacturing a semiconductor integrated circuit device according to any of the paragraphs 1 to 6, the steps (a) and (b) are performed in tandem or partially in parallel.

8. In the method of manufacturing a semiconductor integrated circuit device according to any of the paragraphs 1 to 7, the etch stop film is constituted of a silicon nitride film.

9. In the method of manufacturing a semiconductor integrated circuit device according to any of the paragraphs 1 to 8, the step (c) is a siliciding step of nickel.

10. In the method of manufacturing a semiconductor integrated circuit device according to any of the paragraphs 1 to 9, after the step (e), the step (f) is performed without the first silicon oxide film being subjected to an annealing treatment.

11. In the method of manufacturing a semiconductor integrated circuit device according to any of the paragraphs 1 to 8, the step (c) is a siliciding step of cobalt or a siliciding step of low-order cobalt silicide to higher-order one.

12. The method of manufacturing a semiconductor integrated circuit device according to the paragraph 11, further comprises the step of (o) after the step (e) and before the step (f), performing an annealing treatment of the first main surface side of the semiconductor wafer at a temperature from 700° C. to 750° C.

13. In the method of manufacturing a semiconductor integrated circuit device according to any of the paragraphs 1 to 12, the thickness of the etch stop film at the completion of the film formation is thinner than that of the first silicon oxide film at the completion of the film formation.

14. In the method of manufacturing a semiconductor integrated circuit device according to any of the paragraphs 1 to 13, the thickness of the first silicon oxide film at the completion of the film formation is thinner than that of the second silicon oxide film at the completion of the film formation.

15. In the method of manufacturing a semiconductor integrated circuit device according to any of the paragraphs 1 to 14, the fracture toughness of the first silicon oxide film at the start of the step (h) is smaller than that of the second silicon oxide film at the start of the step (h).

16. In the method of manufacturing a semiconductor integrated circuit device according to any of the paragraphs 1 to 15, the step (f) is performed by dry etching.

17. In the method of manufacturing a semiconductor integrated circuit device according to any of the paragraphs 1 to 15, the step (f) is performed by wet etching.

18. In the method of manufacturing a semiconductor integrated circuit device according to any of the paragraphs 1 to 17, the step (e) is performed by quasi ordinary pressure CVD.

19. In the method of manufacturing a semiconductor integrated circuit device according to any of the paragraphs 1 to 18, the step (e) is performed in such a state that the wafer is placed on a wafer stage having a temperature set between 400° C. and 550° C.

20. In the method of manufacturing a semiconductor integrated circuit device according to the paragraph 4, the barrier metal film includes a film of a lower layer containing titanium as a main component and a film of an upper layer containing titanium nitride as a main component.

21. In the method of manufacturing a semiconductor integrated circuit device according to the paragraph 2, the third silicon oxide film is a silicon oxide film formed by plasma CVD using TEOS.

22. In the method of manufacturing a semiconductor integrated circuit device according to any of the paragraphs 1 to 21, the first silicon oxide film is formed using a sheet-feeding CVD apparatus of a cold wall system.

23. A method of manufacturing a semiconductor integrated circuit device comprises the steps of:

(a) forming a plurality of MISFET gate structures including a polysilicon gate electrode on a first main surface of a semiconductor wafer;

(b) forming a source/drain region near the both sides of the respective gate structures of the first main surface of the semiconductor wafer;

(c) after the steps (a) and (b), nickel siliciding the upper surface of the source/drain region;

(d) forming an etch stop film over the first main surface of the semiconductor wafer including the silicided upper surface of the source/drain region;

(e) forming a pre-metal interlayer insulating film constituted of at least a first silicon oxide film and a second silicon oxide film over the etch stop film; and (f) performing a first chemical mechanical polishing treatment for the upper surface of the second silicon oxide film, wherein the step (e) further includes the steps of:

(e-1) forming the first silicon oxide film by thermal CVD at a temperature from 400° C. to 550° C., and (e-2) forming the second silicon oxide film by plasma CVD.

24. A semiconductor integrated circuit device comprises:

(a) a plurality of MISFET gate structures formed over a first main surface of a semiconductor wafer and including a polysilicon gate electrode;

(b) a source/drain region formed near the both sides of the gate structure of the first main surface of the semiconductor wafer;

(c) an etch stop film formed over the first main surface of the semiconductor wafer including the upper surface of the gate structure and the upper surface of the source/drain region;

(d) a first silicon oxide film that is a part of an interlayer insulating film buried between the respective gate structures and is formed by a thermal CVD method, the first silicon film being formed so as to expose the etch stop film formed in the upper surface of the gate structure;

(e) a second silicon oxide film that is a part of the interlayer insulating film and is formed over the etch stop film formed over the first silicon oxide film and the upper surface of the gate structure, which is formed by a plasma CVD method; and (f) a connection hole in which a plug electrically connecting the source/drain region and a wiring formed over the interlayer insulating film is buried.

25. A semiconductor integrated circuit device comprises:

(a) a plurality of MISFET gate structures formed over a first main surface of a semiconductor wafer and including a polysilicon gate electrode;

(b) a source/drain region formed near the both sides of the gate structure of the first main surface of the semiconductor wafer;

(c) a silicide film formed in the upper surface of the source/drain region;

(d) an etch stop film formed over the first main surface of the semiconductor wafer including the upper surface of the gate structure member and the upper surface of the silicide film of the source/drain region;

(e) a first silicon oxide film that is a part of an interlayer insulating film buried between the respective gate structures and is formed so as not to cover the etch stop film formed in the upper surface of the gate structure member;

(f) a second silicon oxide film that is a part of the interlayer insulating film and is formed over the first silicon oxide film and the etch stop film formed in the upper surface of the gate structure; and (g) a connection hole in which a plug electrically connecting the silicide film formed in the upper surface of the source/drain region and a wiring formed over the interlayer insulating film is buried.

26. A semiconductor integrated circuit device comprises:

(a) a plurality of MISFET gate structures formed over a first main surface of a semiconductor wafer and including a polysilicon gate electrode;

(b) a source/drain region formed near the both sides of the gate structure of the first main surface of the semiconductor wafer;

(c) a silicide film formed in the upper surface of the source/drain region;

(d) an etch stop film formed over the first main surface of the semiconductor wafer including the upper surface of the gate structure member and the upper surface of the silicide film;

(e) an interlayer insulating film that is constituted of at least a first silicon oxide film and a second silicon oxide film and is buried between the respective gate structures; and (g) a connection hole in which a plug electrically connecting the silicide film formed in the upper surface of the source/drain region and a wiring formed over the interlayer insulating film is buried, wherein the first silicon oxide film is formed so as not to cover the etch stop film formed in the upper surface of the gate structure;

wherein the second silicon oxide film is formed over the first silicon oxide film and the etch stop film formed in the upper surface of the gate structure; and wherein the hardness of the first silicon oxide film is lower than that of the second silicon oxide film.

[Explanation of Description Form, Basic Terms and Usage in the Present Application]

1. In the application, embodiments may occasionally be described while being divided into a plurality of sections as needed for convenience. Except for cases clearly specified to the contrary in particular, these are not independent or separated from each other, but these are respective portions of a single example, one is details of a part or a modification example of a part or the whole of the other, and the like. Further, repetition of similar portions are omitted in principle. Furthermore, respective constituents in embodiments are not indispensable, except for such cases that contradictory definition is clearly made in particular, that the theory limits to the number, and that contradictory fact is clear from the context.

2. Similarly, in the description of embodiments and the like, an expression "X consisting of A" for materials, compositions and the like does not exclude those having an element other than A as one main constituent, except for such cases that contradictory definition is clearly made in particular and contradictory fact is clear from the context. For example, regarding the component, it has such meaning as "X containing A as a main component" and the like. For example, needless to say, a "silicon member" is not limited to pure silicon, but includes SiGe alloy and other multi-component alloys having silicon as a main component, and members containing other additives and the like.

"Copper, tungsten, titanium, titanium nitride, aluminum" and the like include not only pure ones, but also members including these members as a main component, except for such case that contradictory definition is clearly made in particular and contradictory fact is theoretically clear.

Similarly, a "silicon oxide film" includes, needless to say, not only relatively pure undoped silicon dioxide, but also FSG (Fluorosilicate Glass), TEOS-based silicon oxide, SiOC (Silicon Oxicarbide) or Carbon-doped Silicon oxide or thermal oxide films such as OSG (Organosilicate glass), PSG (Phosphorus Silicate Glass) and BPSG (Borophosphosilicate Glass), CVD oxide films, coating-based silicon oxide such as SOG (Spin ON Glass) and Nano-Clustering Silica (NSC), silica-based low-k insulating film (porous insulating film) formed by introducing holes into members similar to these, and composite films including these as a main constituent with another silicon-based insulating film, and the like.

Further, "silicon nitride" is intended to include not only pure one, but also members containing the member as a main component, except for such cases that contradictory definition is clearly made in particular and contradictory fact is theoretically clear. Particularly, silicon nitride members frequently used in this technical field include considerable amount of hydrogen atoms in many cases. In the application, "silicon nitride" include such silicon nitride members.

Furthermore, the nickel silicide described in the specification is not limited to the silicide film consisting of only nickel (Ni) and silicon (Si), but includes also silicide films formed by adding other metal, for example, such as platinum (Pt), palladium (Pd), yttrium (Y), ytterbium (Yb), erbium (Er) and vanadium (V) to a silicide film having nickel as a main component.

3. Similarly, favorable examples are shown for figures, positions, attributes and the like, but, needless to say, they are not limited strictly to these examples except for such cases that contradictory definition is clearly made in particular and contradictory fact is clear from the context.

4. Further, when referred to a specified numerical value or quantity, too, a value over the specified value or a value less than the specified value may be acceptable, except for such cases that contradictory definition is clearly made, that the theory limits the value to the specified value, and that contradictory fact is clear from the context.

5. A "wafer" or "semiconductor" usually refers to a single crystal silicon wafer for forming a semiconductor integrated circuit device (the same applies to a semiconductor device and an electronic device) thereon, but, needless to say, it also includes composite wafers of an insulating substrate such as an epitaxial wafer, SOI substrate and LCD glass substrate with a semiconductor layer and the like.

6. A "gate structure" means a structure with a gate electrode including a MISFET gate electrode, a gate insulating film, a side wall and the like as a central component.

7. A "pre-metal insulating film" means an interlayer insulating film formed in a lower layer than such wiring layers as a tungsten first layer wiring layer, a copper-based damascene first layer wiring layer or an aluminum-based first wiring layer, namely, generally at the same layer as a tungsten plug, in an upper layer than the etch stop film for forming a substrate contact hole such as a silicon nitride film, and in a lower layer than an insulating barrier film under the lowermost damascene wiring layer or the lowermost wiring. Generally, it is often constituted of a single layer film or multi layer film of 2 to 4 layers. However, although such uppermost layer as the cap film is occasionally removed wholly by a tungsten plug CMP treatment and does not remain in the final structure, on the way of the manufacturing process, the cap film also may constitute a part of the pre-metal insulating film.

8. "Chemical mechanical polishing" or "CMP" can be classified into insulating film CMP and metal CMP, when it is generally divided based on the object. When it is classified based on a polishing mechanism, it can be classified into general CMP using suspended abrasive grains, CMP using fixed abrasive grains, ECMP utilizing an electric field action, and the like. In the application, it is used in a meaning that includes all of them.

9. "Quasi ordinary pressure CVD" means so-called SA-CVD (Sub-Atmospheric CVD), and is performed, usually, under a pressure in a range around from 2 KPa to 80 KPa.

10. A "cold wall system" regarding a CVD apparatus and the like means one so designed that a heat source exists at a wafer stage portion or near the portion and heats a wafer to be treated and a wafer stage (including a resistance heat source) to the highest temperature (wafer treatment temperature, namely the preset temperature of the wafer stage), and that the wall portion of the chamber has a relatively low temperature. "Sheet-feeding" means treating a wafer by one unit. There are included such systems as performing the treatment while housing one wafer in a chamber, and performing the treatment while housing a plurality of (for example, 2 to 4) wafers in connected chambers having wafer stages independent from each other, and the like.

11. Regarding the top and bottom relationship of the stacked structure on a wafer, irrespective of the direction of the gravity at that time, the rear surface of the wafer is defined as the bottom, and the direction towards the device surface of the wafer is defined as the top.

Details of Embodiment

Further details of the embodiment will be described. In respective drawings, the same or similar portions are shown by the same or similar symbol or reference number, and, basically, the description is not repeated. Meanwhile, following respective embodiments relate to silicon-based semiconductor integrated circuit devices formed by integrating CMOS (Complementary Metal Oxide Semiconductor) FETs or CMIS (Complementary Metal Insulator Semiconductor) FETs, and have an approximately symmetrical P-N structure. Therefore, in the drawings, the N-channel device side is mainly exemplified and specifically described.

1. Description of a Device Structure of a Semiconductor Integrated Circuit Device According to a Method of Manufacturing a Semiconductor Integrated Circuit Device of the Embodiment of the Application (Mainly FIG. 1)

FIG. 1 is a device cross-sectional view showing one example of the cross-sectional structure of a device of 65 nm technology node according to the embodiment of the method of the application for manufacturing a semiconductor integrated circuit device. On the basis of FIG. 1, the outline of the device structure of the semiconductor integrated circuit device according to the embodiment of the method of the application for manufacturing a semiconductor integrated circuit device will be described.

As shown in FIG. 1, for example, over the device surface of a P-type single crystal silicon substrate 1 separated by an STI (Shallow Trench Isolation)-type element isolation field insulating film 2, a gate electrode 8 of a P channel MOSFET or an N channel MOSFET is formed. Above them, a silicon nitride liner film 4 (for example, about 30 nm) being the etch stop film is formed. On it, a pre-metal interlayer insulating film 5, which is constituted of an ozone TEOS silicon oxide film (for example, about 200 nm) being a lower layer formed by a thermal CVD method and a plasma TEOS silicon oxide film (for example, about 270 nm) being an upper layer and the like, is formed to give a much greater thickness as compared with the silicon nitride liner film 4. Further, through the pre-metal insulating film, a tungsten plug 3 is formed. The region up to here is a pre-metal region PM.

A first wiring layer M1 formed thereon is constituted of an insulating barrier film 14 such as a SiCN film (for example, about 50 nm) being a lower layer, a plasma silicon oxide film 15 (for example, about 150 nm) being a main interlayer insulating film and the like, a copper wiring 13 buried in a wiring groove formed thereto and the like.

A second wiring layer to a sixth wiring layer M2, M3, M4, M5 and M6 formed thereover have approximately the same structure with one another. Respective layers are constituted of composite insulating barrier films (liner film) 24, 34, 44, 54 or 64 consisting of a SiCO film (for example, about 30 nm)/SiCN film (for example, about 30 nm) and the like being a lower layer, and main interlayer insulating film 25, 35, 45, 55 or 65, which occupies almost all the region of an upper layer, and the like. The main interlayer insulating films 25, 35, 45, 55 and 65 are constituted of a carbon-doped silicon oxide film, that is, a SiOC film (for example, about 350 nm) and a plasma TEOS silicon oxide film (for example, about 80 nm) and the like starting from the lower layer. Passing through these interlayer insulating films, copper buried wirings 23, 33, 43, 53 and 63 including a copper plug and copper wiring are formed.

A seventh wiring layer M7 and an eighth wiring layer M8 thereover have approximately the same structure with each other. Respective layers consist of an insulating barrier film 74 or 84 of SiCN film (for example, about 70 nm) and the like being a lower layer, and a main interlayer insulating film 75 or 85 and the like being an upper layer. These main interlayer insulating films 75 and 85 consist of a plasma TEOS silicon oxide film (for example, about 250 nm), an FSG film (for example, about 300 nm), a USG film (for example, about 200 nm) being a cap film, and the like, starting from a lower layer. Passing through these interlayer insulating films, copper buried wirings 73 and 83 including a copper plug and copper wiring are formed.

A ninth wiring layer M9 and a tenth wiring layer M10 thereover have approximately the same structure with each other. Respective layers are separated into an interlayer being a lower layer and an intralayer being an upper layer. The interlayer insulating film consists of insulating barrier film 94$b$ or 104$b$ such as a SiCN film (for example, about 70 nm) and the like being a lower layer, and a main interlayer insulating film and the like being an upper layer. The main interlayer insulating film is constituted of a FSG film 95$b$ or 105$b$ (for example, about 800 nm) being a lower layer, a USG film 96$b$ or 106$b$ (for example, about 100 nm) being a cap film of an upper layer, and the like. Further, the intralayer insulating film is constituted of an insulating barrier film 94$a$ or 104$a$ such as a SiCN film (for example, about 50 nm) being a lower layer, the main interlayer insulating film being an upper layer, and the like. The main intralayer insulating film is constituted of an FSG film 95$a$ or 105$a$ (for example, about 1200 nm) being a lower layer, and a USG film 96$a$ or 106$a$ (for example, about 100 nm) being a cap film of an upper layer, and the like. Passing through these interlayer insulating film and intralayer insulating film, and the like, copper buried wirings 93 and 103 including a copper plug and copper wiring are formed.

The uppermost wiring layer AP formed thereover is constituted of an insulating barrier film such as a SiCN film 114 (for example, about 100 nm) being a lower layer and the like, an intermediate main interlayer insulating film such as a USG film 117 (for example, about 900 nm) and the like, and an outermost final passivation film such as a plasma SiN 119 (for example, about 600 nm) and the like. Further, passing through these interlayer insulating films, a tungsten plug 113 is provided, and, on the USG film 117, an aluminum wiring 118 (for example, about 1000 nm) and a bonding pad are provided.

2. Description of a Process Flow (Nickel Silicide Process) According to the Method of Manufacturing a Semiconductor Integrated Circuit Device of One Embodiment of the Application (Mainly from FIGS. 2 to 14)

Figure 2:
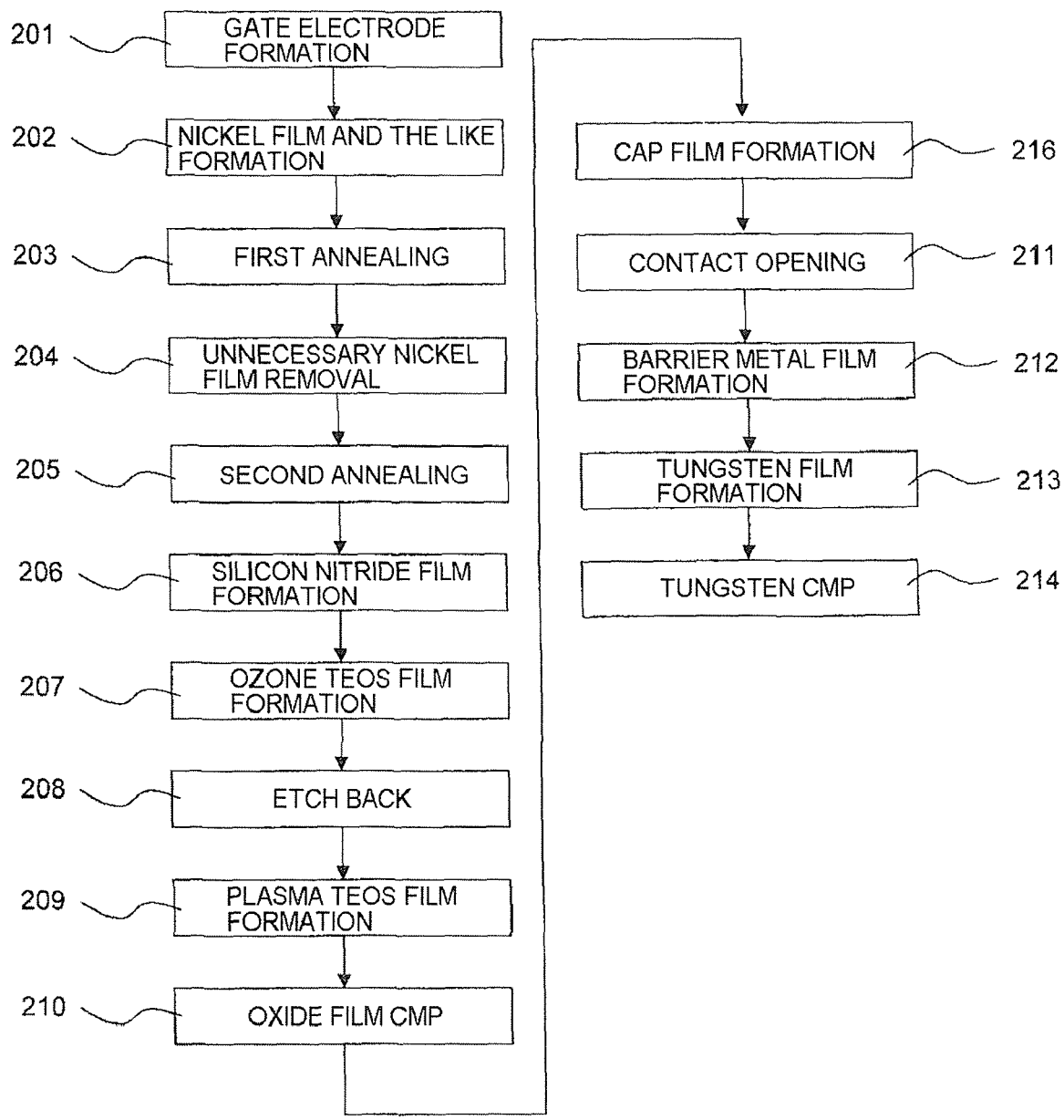
FIG. 2 is a process block flow chart in the method of manufacturing a semiconductor integrated circuit device (nickel silicide process) of one embodiment of the present invention.
Figure 3:
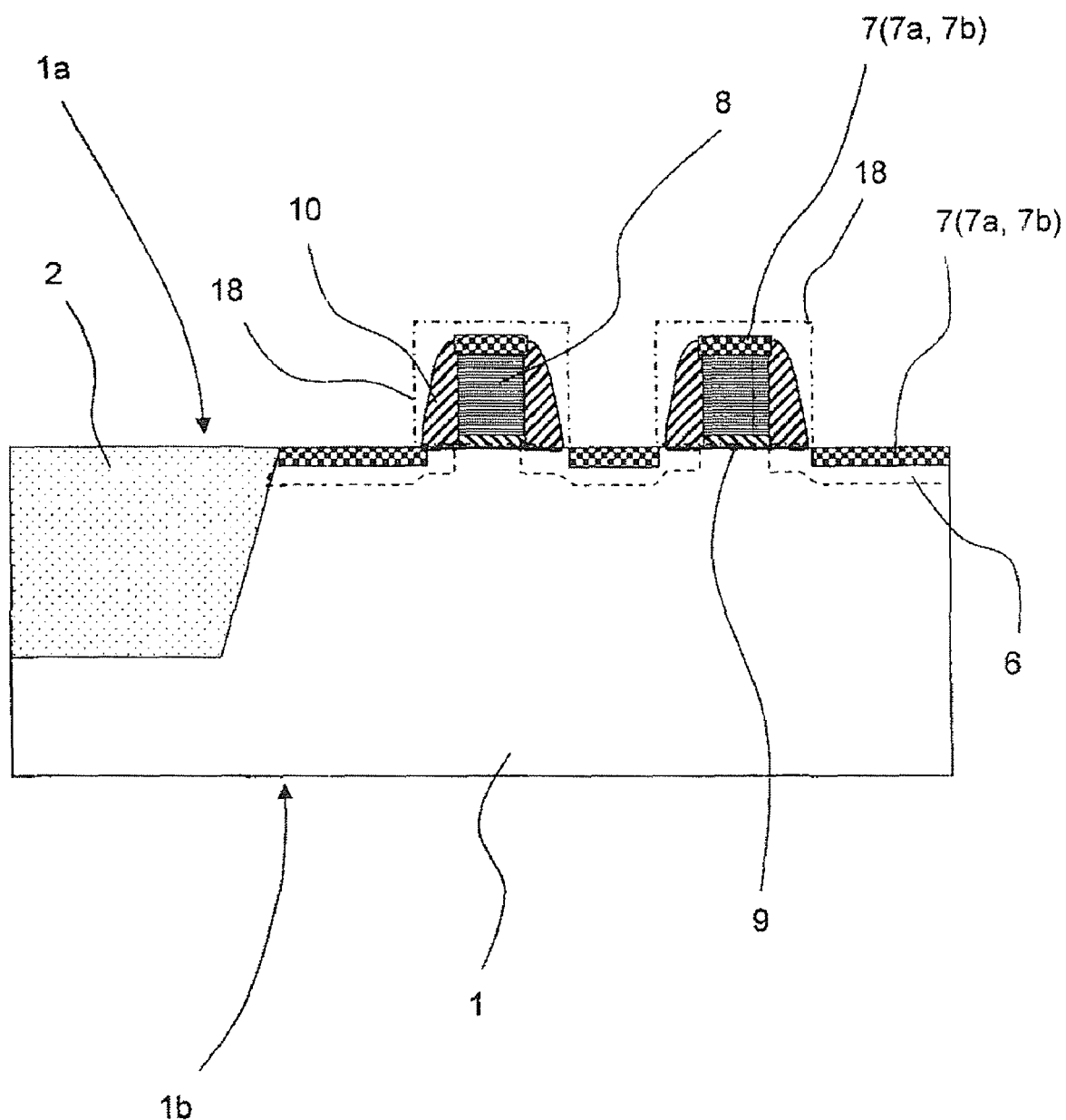
FIG. 3 is a process cross-sectional flow diagram (the siliciding step of a source/drain region and the upper surface of a gate electrode) according to the method of manufacturing a semiconductor integrated circuit device (nickel silicide process) of one embodiment of the present invention.
Figure 4:
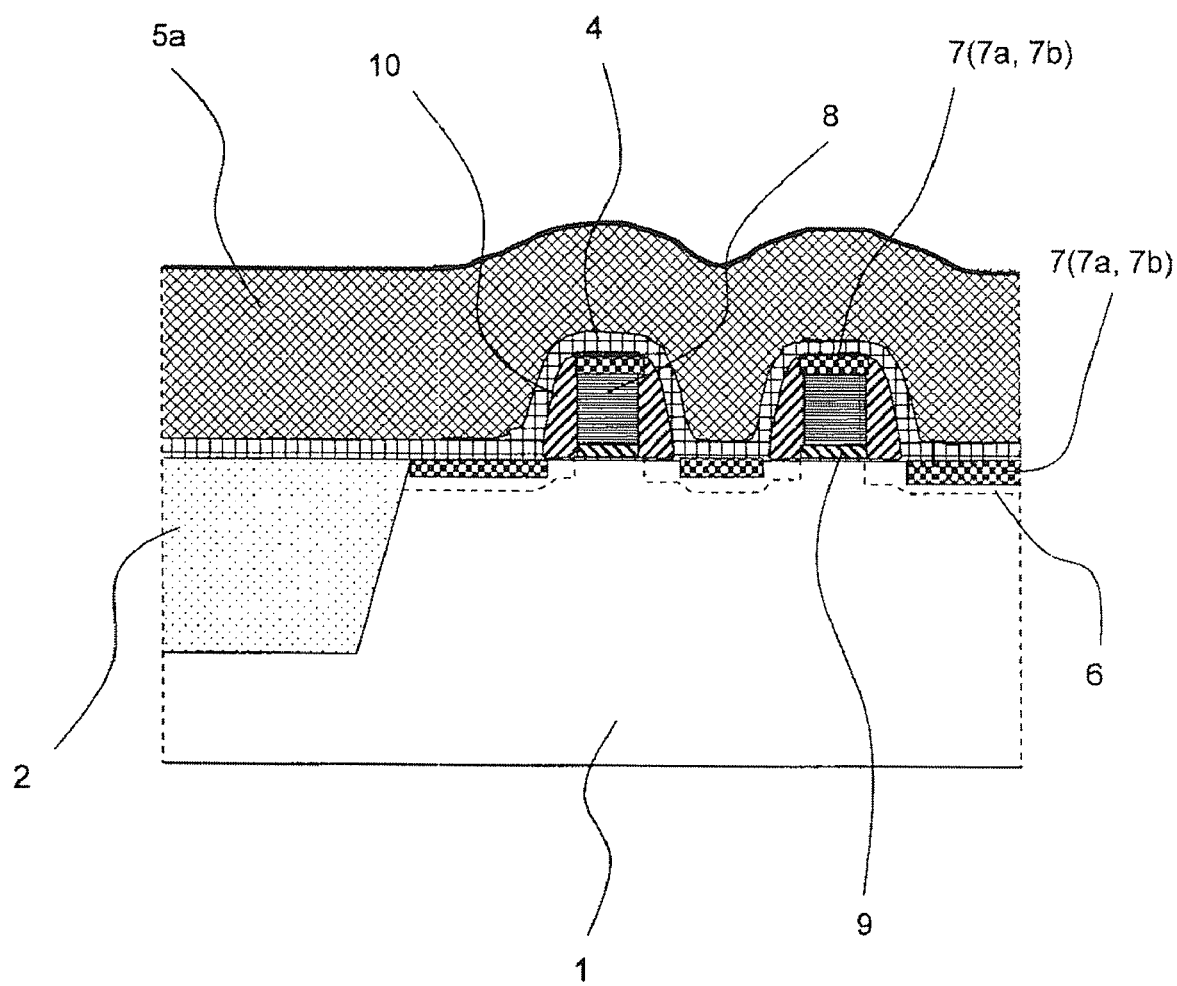
FIG. 4 is a process cross-sectional flow diagram (ozone TEOS film formation process) in the method of manufacturing a semiconductor integrated circuit device (nickel silicide process) of one embodiment of the present invention.
Figure 5:
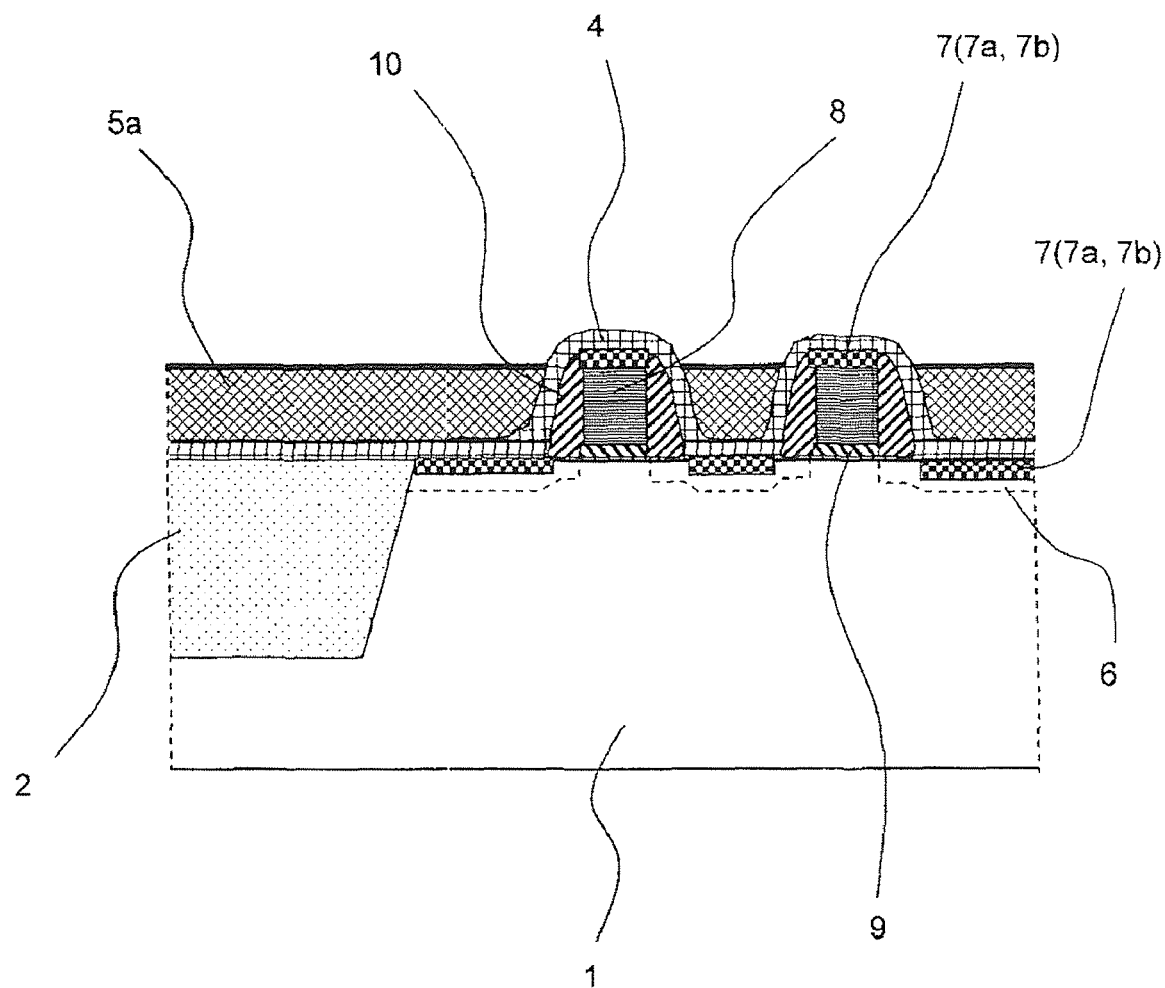
FIG. 5 is a process cross-sectional flow diagram (ozone TEOS etch back process) in the method of manufacturing a semiconductor integrated circuit device (nickel silicide process) of one embodiment of the present invention.
Figure 6:
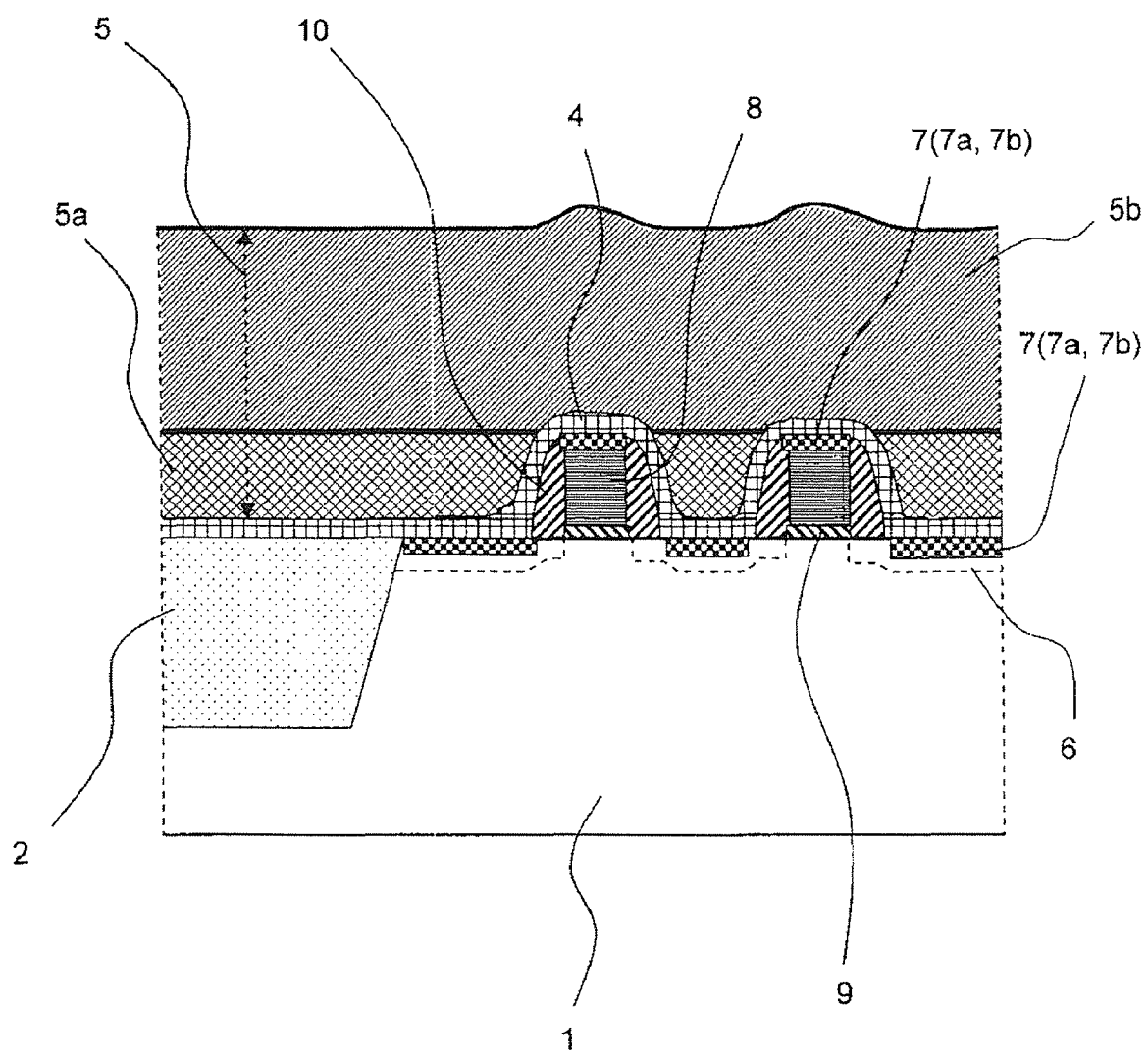
FIG. 6 is a process cross-sectional flow diagram (plasma TEOS film formation process) in the method of manufacturing a semiconductor integrated circuit device (nickel silicide process) of one embodiment of the present invention.
Figure 7:
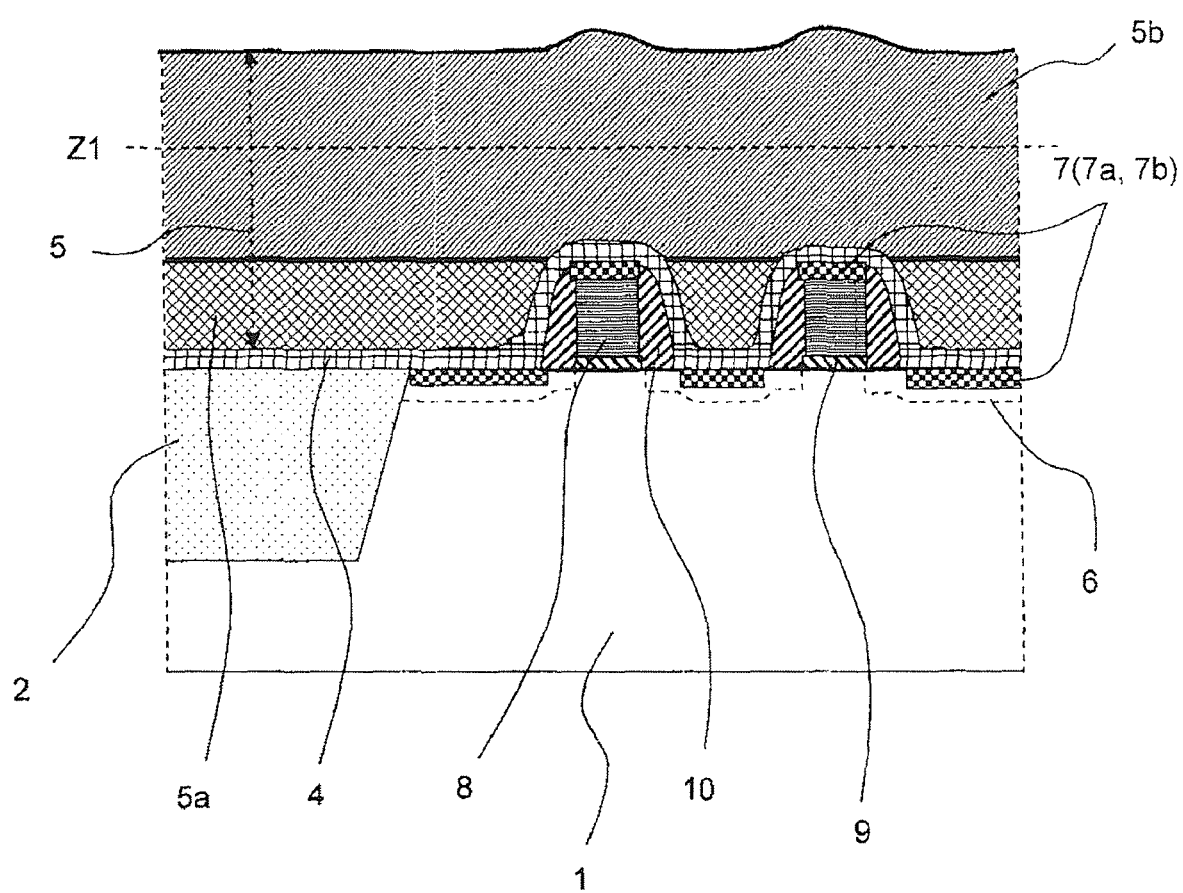
FIG. 7 is a process cross-sectional flow diagram (plasma TEOS film CMP process start point) in the method of manufacturing a semiconductor integrated circuit device (nickel silicide process) of one embodiment of the present invention.
Figure 8:
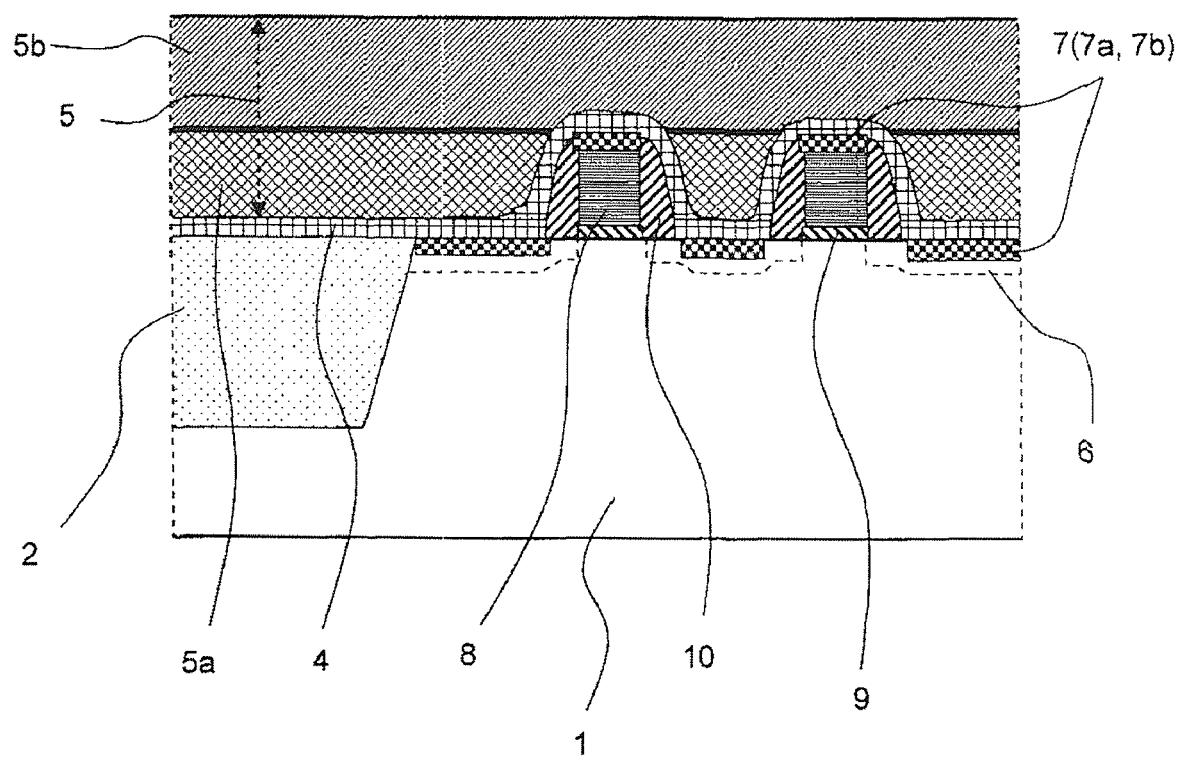
FIG. 8 is a process cross-sectional flow diagram (plasma TEOS film CMP process end point) in the method of manufacturing a semiconductor integrated circuit device (nickel silicide process) of one embodiment of the present invention.
Figure 9:
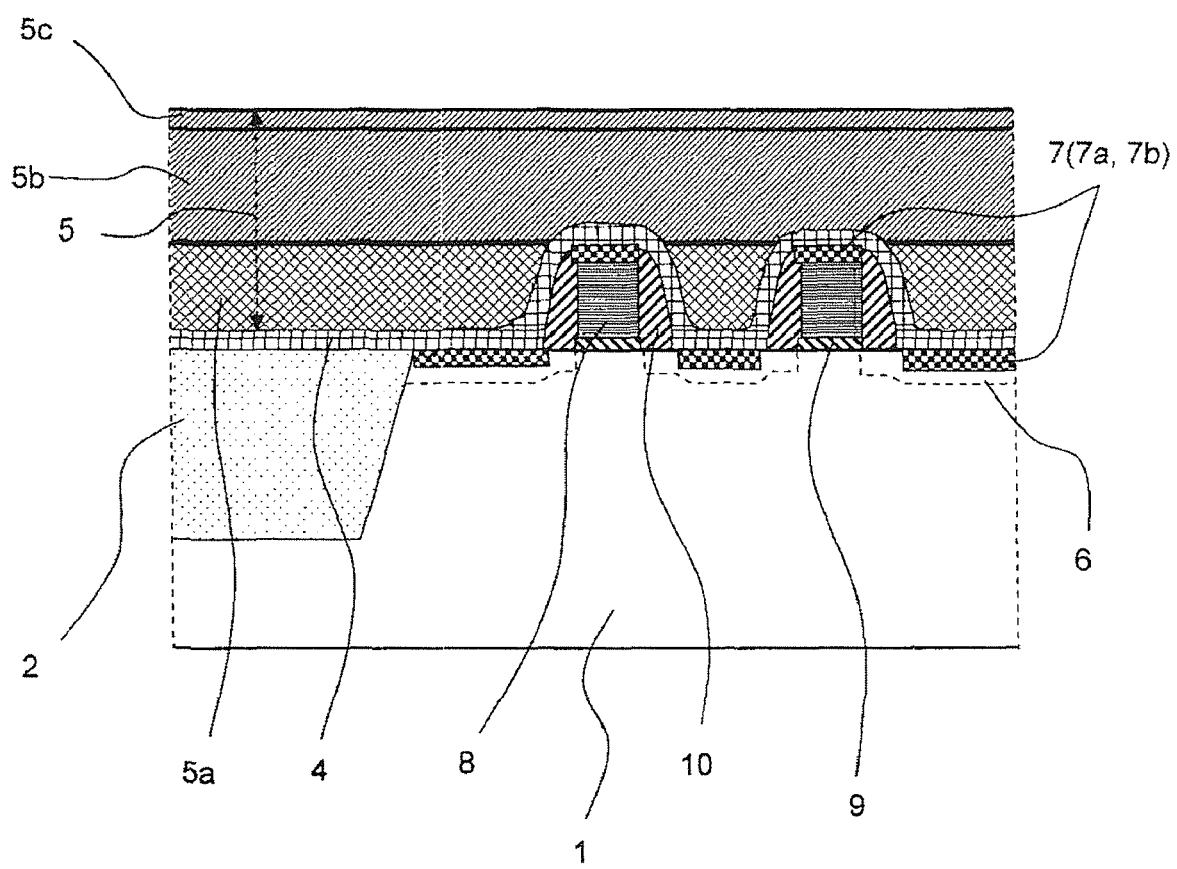
FIG. 9 is a process cross-sectional flow diagram (cap plasma TEOS film formation process) in the method of manufacturing a semiconductor integrated circuit device (nickel silicide process) of one embodiment of the present invention.
Figure 10:
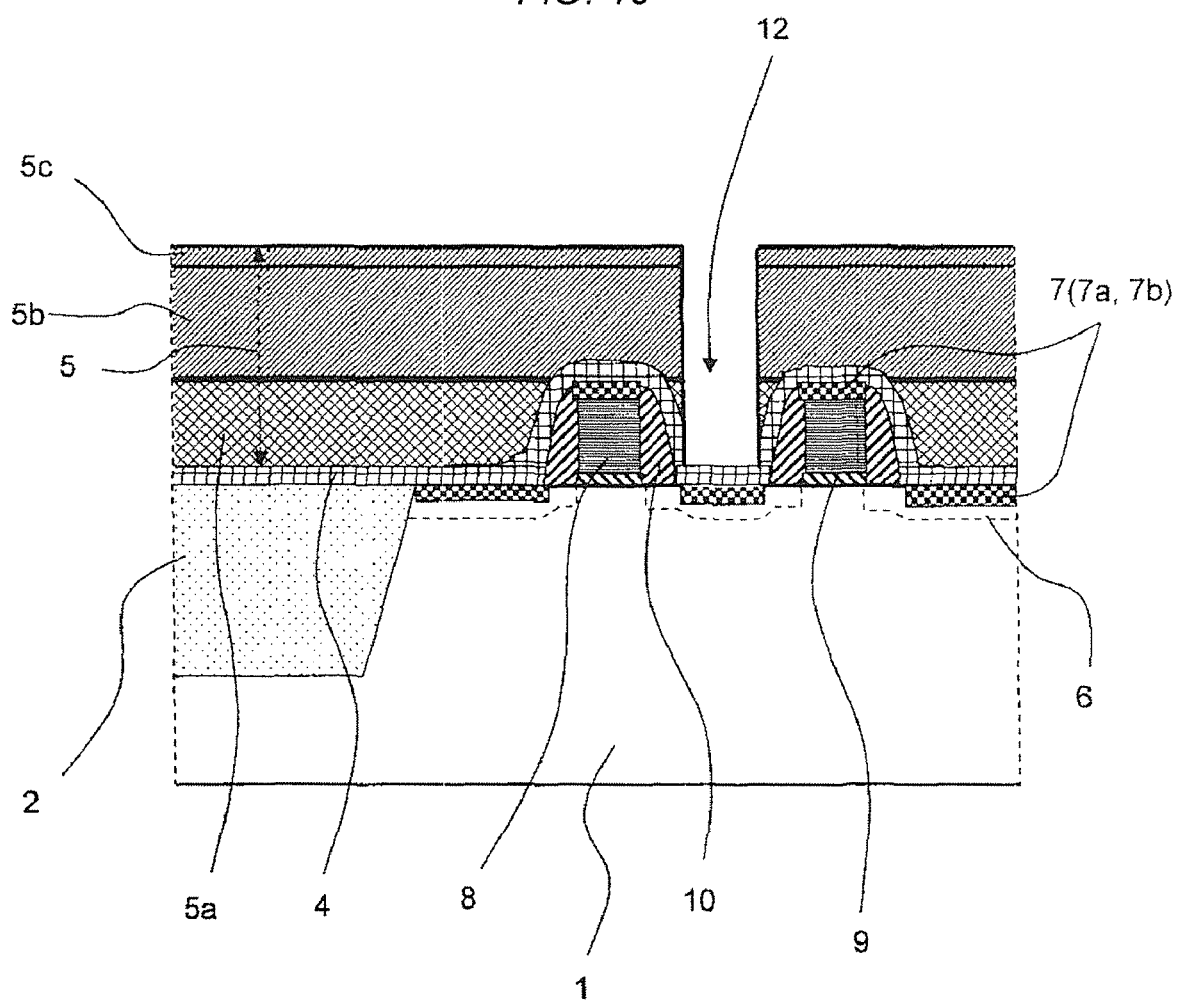
FIG. 10 is a process cross-sectional flow diagram (contact hole formation process) in the method of manufacturing a semiconductor integrated circuit device (nickel silicide process) of one embodiment of the present invention.
Figure 11:
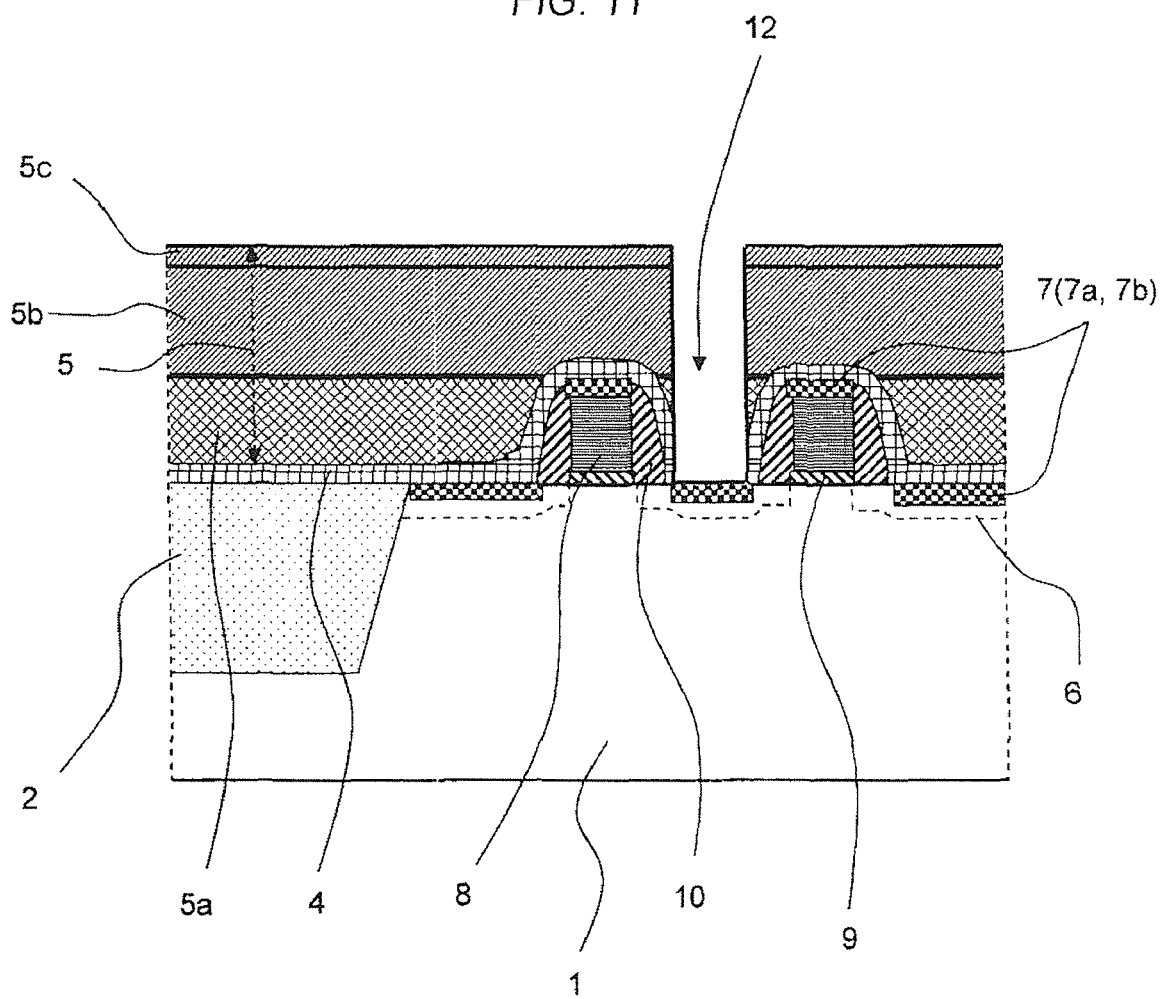
FIG. 11 is a process cross-sectional flow diagram (process of removing the etch stop film at the bottom of the contact hole) in the method of manufacturing a semiconductor integrated circuit device (nickel silicide process) of one embodiment of the present invention.
Figure 12:
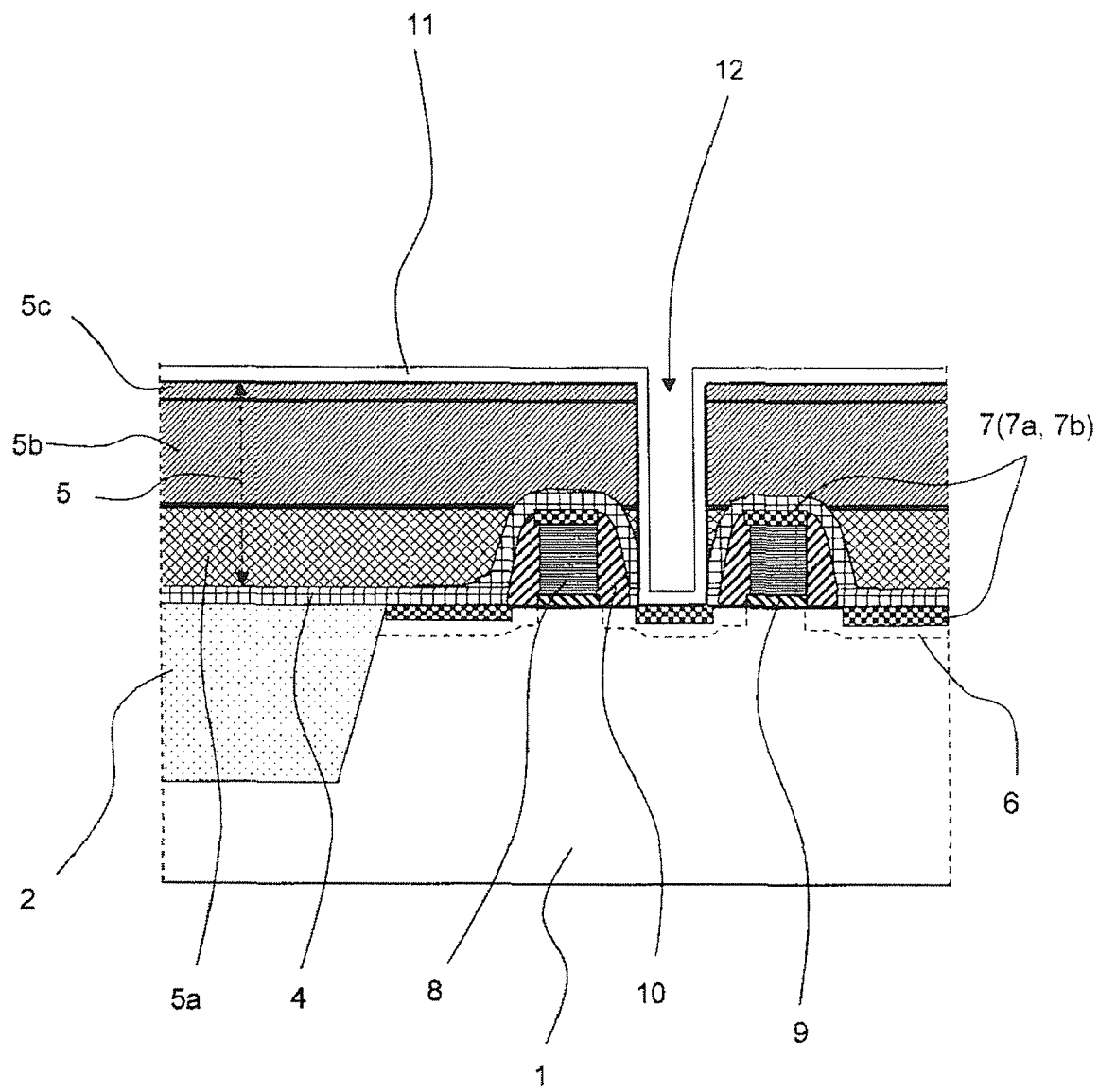
FIG. 12 is a process cross-sectional flow diagram (barrier metal film formation process) in the method of manufacturing a semiconductor integrated circuit device (nickel silicide process) of one embodiment of the present invention.
Figure 13:
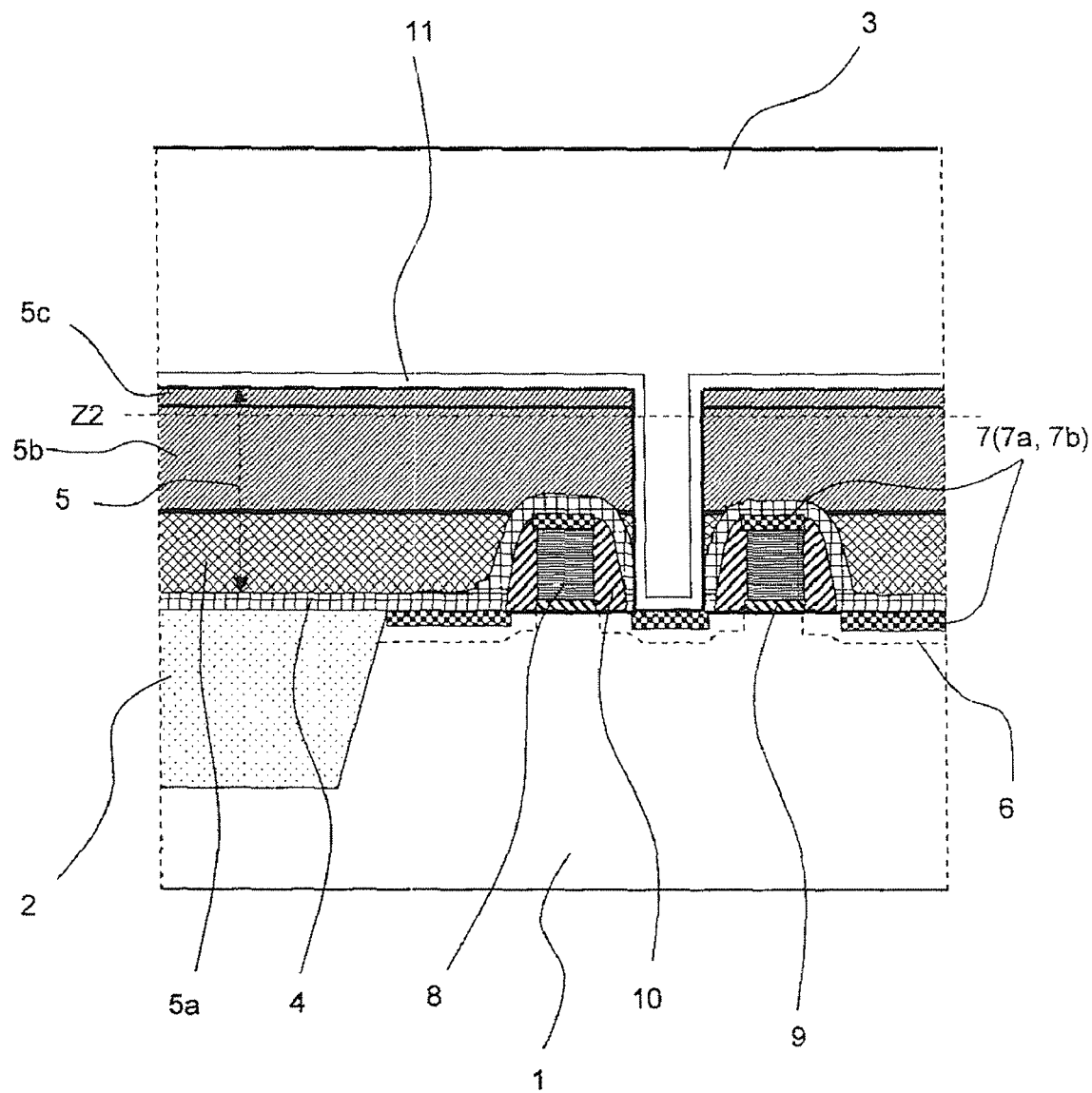
FIG. 13 is a process cross-sectional flow diagram (tungsten film formation process) in the method of manufacturing a semiconductor integrated circuit device (nickel silicide process) in the method of manufacturing a semiconductor integrated circuit device (nickel silicide process) of one embodiment of the present invention.
Figure 14:
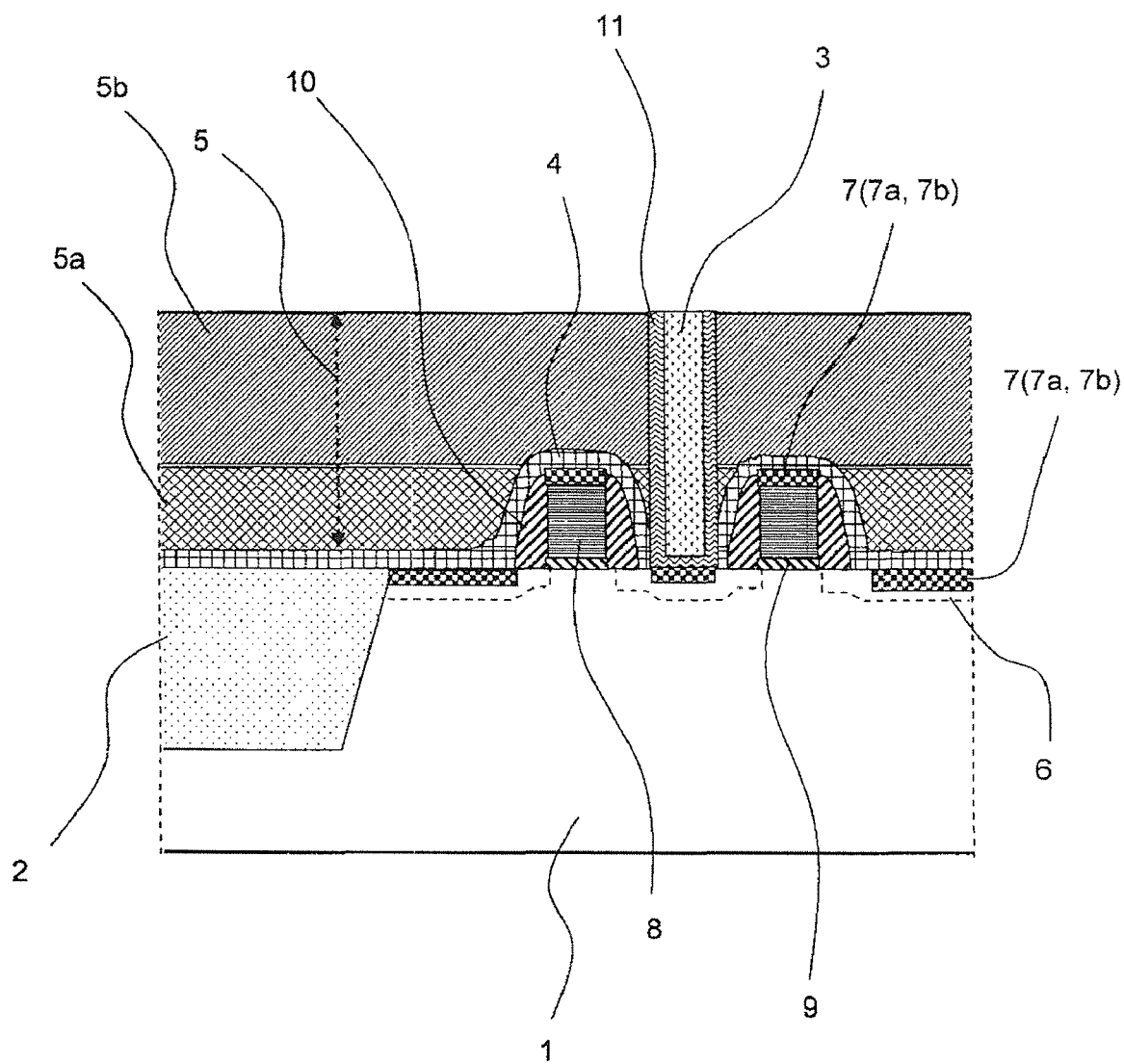
FIG. 14 is a process cross-sectional flow diagram (tungsten CMP process end point) in the method of manufacturing a semiconductor integrated circuit device (nickel silicide process) of one embodiment of the present invention.

FIG. 2 is a process block flow chart in the method of manufacturing of a semiconductor integrated circuit device (nickel silicide process) according to one embodiment of the present invention. FIG. 3 is a process cross-sectional flow diagram in the method of manufacturing a semiconductor integrated circuit device (nickel silicide process) according to one embodiment of the present invention. FIG. 4 is a process cross-sectional flow diagram (ozone TEOS film formation process) in the method of manufacturing a semiconductor integrated circuit device (nickel silicide process) according to one embodiment of the present invention. FIG. 5 is a process cross-sectional flow diagram (ozone TEOS etch back process) in the method of manufacturing a semiconductor integrated circuit device (nickel silicide process) according to one embodiment of the present invention. FIG. 6 is a process cross-sectional flow diagram (plasma TEOS film formation process) in the method of manufacturing a semiconductor integrated circuit device (nickel silicide process) according to one embodiment of the present invention. FIG. 7 is a process cross-sectional flow diagram (plasma TEOS film CMP process start point) in the method of manufacturing a semiconductor integrated circuit device (nickel silicide process) according to one embodiment of the present invention. FIG. 8 is a process cross-sectional flow diagram (plasma TEOS film CMP process end point) in the method of manufacturing a semiconductor integrated circuit device (nickel silicide process) according to one embodiment of the present invention. FIG. 9 is a process cross-sectional flow diagram (cap plasma TEOS film formation process) in the method of manufacturing a semiconductor integrated circuit device (nickel silicide process) according to one embodiment of the present invention. FIG. 10 is a process cross-sectional flow diagram (contact hole formation process) in the method of manufacturing a semiconductor integrated circuit device (nickel silicide process) according to one embodiment of the present invention. FIG. 11 is a process cross-sectional flow diagram (removal process of an etch stop film at the bottom of a contact hole) in the method of manufacturing a semiconductor integrated circuit device (nickel silicide process) according to one embodiment of the present invention. FIG. 12 is a process cross-sectional flow diagram (barrier metal film formation process) in the method of manufacturing a semiconductor integrated circuit device (nickel silicide process) according to one embodiment of the present invention. FIG. 13 is a process cross-sectional flow diagram (tungsten film formation process) in the method of manufacturing a semiconductor integrated circuit device (nickel silicide process) according to one embodiment of the present invention. FIG. 14 is a process cross-sectional flow diagram (tungsten CMP process end point) in the method of manufacturing a semiconductor integrated circuit device (nickel silicide process) according to one embodiment of the present invention. On the basis of these, a process flow (nickel silicide process) in the method of manufacturing a semiconductor integrated circuit device according to one embodiment of the present invention will be described.

First, the flow until the gate electrode formation process 201 shown in FIG. 2 (until reaching the state of FIG. 3) is briefly described. Firstly, for example, a P-type silicon single crystal wafer 1 of 300ϕ (refer to FIG. 3, hereinafter the same) is prepared (Wafer may have a size of 200ϕ, 450ϕ or other dimension. Further, the impurity type may be an N-type, according to need. Furthermore, the wafer may be of an epitaxial type, or an insulative wafer such as an SOI wafer). Next, on the surface region of the device surface 1$a$ (the surface on the opposite site is a rear surface 1$b$) of the wafer 1, STI (Shallow Trench Isolation) region 2 is formed. Here, the STI region 2 has, for example, a depth of around 300 nm, and, for example, a width of around 70 nm.

Subsequently, an N-type well region is formed under the device surface 1$a$ corresponding to the P channel MISFET formation region, in a P channel MISFET formation region and an N channel MISFET formation region. Next, on the surface of the device surface 1$a$ of the wafer 1, a silicon oxide film 9 or a silicon oxynitride film having a thickness of, for example, around from 2 nm to 4 nm is formed by thermal oxidation and the like. On it, a non-doped polysilicon film 8 having a thickness of, for example, around 150 nm is formed by a CVD method. Next, a resist film is coated on the whole surface of the device surface 1$a$ of the wafer 1, and resist film patterns for doping a P-type impurity to a polysilicon film 8 are formed by usual lithography. The resist film (the same for resists below) is, for example, a chemical amplification type positive resist (such as a polyhydroxy styrene-based one). Subsequently, in a state where the N channel MISFET formation region is covered with the resist film (resist film pattern), a P-type impurity ion implantation treatment (for example, boron ions, dose amount of around $2\times10^{15}/cm^2$) is practiced. After that, unnecessary resist film patterns are removed.

Next, a resist film is coated on the whole surface of the device surface 1a of the wafer 1, and resist film patterns for doping an N-type impurity to a polysilicon film 8 are formed by usual lithography. Subsequently, in a state where the P channel MISFET formation region is covered with the resist film (resist film pattern), an N-type impurity ion implantation treatment (for example, phosphorous ions, dose amount of around $6\times10^{15}/cm^2$) is practiced. After that, unnecessary resist film patterns are removed.

Next, a resist film is coated on the whole surface of the device surface 1a of the wafer 1, and resist film patterns for patterning the gate electrode are formed by usual lithography. Subsequently, in a state where the resist film pattern for patterning the gate electrode exists, dry etching of the polysilicon film 8 is practiced to form the gate electrode 8 having a width of around 65 nm. The dry etching of the polysilicon film 8 can be practiced, for example, using a mixed gas of HBr, $Cl_2$, $O_2$ and the like. Subsequently, unnecessary resist film patterns are removed.

Next, a resist film is coated on the whole surface of the device surface 1a of the wafer 1, and resist film patterns for doping a P-type impurity to portions to be a P-type source/drain extension region (P-type LDD region) of the surface 1a of an N-type well region of the semiconductor substrate 1 are formed by usual lithography. Subsequently, in a state where the N channel MISFET formation region is covered with the resist film (resist film pattern), a P-type impurity ion implantation treatment (for example, $BF_2$+ in a dope amount of $3\times10^{14}$ cm$^{-2}$) is practiced to the whole surface. Subsequently, unnecessary resist film patterns are removed.

Next, a resist film is coated on the whole surface of the device surface 1a of the wafer 1, and resist film patterns for doping an N-type impurity to portions to be an N-type source/drain extension region (N-type LDD region) of the surface 1a of the semiconductor substrate 1 are formed by usual lithography. Subsequently, in a state where the P channel MISFET formation region is covered with the resist film (resist film pattern), an N-type impurity ion implantation treatment (for example, As+ in a dope amount of $1\times10^{15}$ cm$^{-2}$) is practiced to the whole surface. After that, unnecessary resist film patterns are removed.

Next, an insulating film (for example, a film consisting of a lower layer ozone TEOS film having a thickness of around 10 nm and an upper layer silicon nitride film having a thickness of around 45 nm) to be a side wall spacer is formed on the whole surface of the device surface 1a of the wafer 1 by a CVD method. Next, it is etched back by anisotropic dry etching to form a side wall 10.

Next, a resist film is coated on the whole surface of the device surface 1a of the wafer 1, and resist film patterns for doping a P-type impurity to a portion to be a high concentration P-type source/drain region of the surface 1a of the N-type well region of the semiconductor substrate 1 are formed by usual lithography. Subsequently, in a state where the N channel MISFET formation region is covered with the resist film (resist film pattern), a P-type impurity ion implantation treatment (for example, B+ in a dope amount of $4\times10^{15}$ cm$^{-2}$) is practiced to the whole surface. After that, unnecessary resist film patterns are removed.

Next, a resist film is coated on the whole surface of the device surface 1a of the wafer 1, and resist film patterns for doping an N-type impurity to a portion to be a high concentration N-type source/drain region of the surface 1a of the semiconductor substrate 1 are formed by usual lithography. Subsequently, in a state where the P channel MISFET formation region is covered with the resist film (resist film pattern), an N-type impurity ion implantation treatment (for example, a two-step treatment of As+ in a dope amount of $4\times10^{14}$ cm$^{-2}$, and subsequent P+ in a dope amount of $5\times10^{14}$ cm$^{-2}$) is practiced to the whole surface. After that, unnecessary resist film patterns are removed. As described above, as shown in FIG. 3, an N-type source/drain impurity region 6 constituted of the N-type source/drain extension region and the high concentration N-type source/drain region is formed (it is similar to the P-type source/drain impurity region).

Next, a natural oxide film on the upper surface 1a of the semiconductor substrate (wafer) is removed to expose the substrate upper surface 1a. In the state, a nickel film and a titanium nitride film being the cap film are formed on the approximately whole surface by sputtering (in FIG. 2, nickel film and the like formation process 202). After that, the wafer upper surface 1a is subjected to an annealing treatment at a temperature of around 300° C. (in a non-oxidizing atmosphere) to allow the nickel film to react with silicon at the portion of the wafer upper surface 1a to form nickel silicide (in FIG. 2, first annealing process 203). After that, an unreacted nickel film and titanium nitride film are removed by wet etching (etching liquid is, for example, a mixed liquid of sulfuric acid and hydrogen peroxide solution) (in FIG. 2, unnecessary nickel film removal process 204). After that, by subjecting again the wafer upper surface 1a to an annealing treatment (in a non-oxidizing atmosphere) at around 500° C., the siliciding reaction is advanced (in FIG. 2, second annealing process 205). This results in, as shown in FIG. 3, the formation of a silicide layer 7 (nickel silicide layer 7a) on the upper portion of the n-type source/drain impurity region 6 (it is similar to the P-type source/drain impurity region) and a gate polysilicon film 8. This results in the formation of a gate structure 18 constituted of a gate oxide film 9, a gate polysilicon film 8, a side wall spacer insulating film 10, a silicide layer 7 on the gate polysilicon and the like.

Next, as shown in FIG. 4, a silicon nitride film 4, for example, having a thickness of around 30 nm is formed on the approximately whole surface of the upper surface 1a of the wafer 1 including on the gate structure 18 by CVD (in FIG. 2, a silicon nitride film formation process 206). On it, in addition, a silicon oxide film 5a (first silicon oxide film) is formed by thermal CVD using ozone and TEOS in a thickness of, for example, around 200 nm so as to bury the region between gate structures 18 (in FIG. 2, ozone TEOS film formation process 207). Here, film formation conditions are such that pressure in a treatment chamber is from 2 kPa to 80 kPa, film formation temperature (preset temperature of the wafer stage) is around from 400° C. to 550° C., a gas flow volume is TEOS/O$_3$/He=1000-5000 mgm/10000-30000 sccm/10000-30000 sccm, and the like.

Next, as shown in FIG. 5, the silicon oxide film 5a is selectively etched back (in such gas atmosphere as a mixed gas of fluorocarbon gas, oxygen gas, argon gas and the like, in a flow volume of, for example, $C_4F_6$, $O_2$, Ar=18/11/1100 sccm, at pressure of 4 Pa, for treatment time of 30 seconds) to expose a silicon nitride film 4 at the upper portion of the gate structure 18 (in FIG. 2, etch back process 208). Meanwhile, the etch back can be simply processed by dry etching as described above, but, when further improving the selection ratio relative to the foundation, wet etching may be utilized using such wet etch solution for etching a silicon oxide film as a buffered hydrofluoric acid solution (mixed solution of HF, $NH_4F$ and $H_2O$). Further, both dry etching (first half) and wet etching (latter half) may be used in combination.

Next, as shown in FIG. 6, a silicon oxide film 5*b* (second silicon oxide film) is formed on the silicon oxide film 5*a* and the silicon nitride film 4 at the upper portion of the gate structure 18 in a thickness of, for example, around 550 nm by plasma CVD using TEOS (in FIG. 2, plasma TEOS film formation process 209). Here, film formation conditions are such that pressure in a treatment chamber is from 300 to 1100 Pa, film formation temperature (preset temperature of the wafer stage) is around from 370° C. to 400° C., a gas flow volume is $TEOS/O_2$=200-1500 sccm/0.5-3.0 slm, high-frequency power (13.56 MHz: 500-1500 W, 400-430 KHz: 250-600 W), and the like. The silicon oxide film 5*b* constitutes the pre-metal interlayer insulating film 5 with the silicon oxide film 5*a* of the foundation.

Next, as shown in FIGS. 7 and 8, the silicon oxide film 5*b* is planarized by a CMP treatment (a first chemical mechanical polishing) (for example, polishes and removes it to a lower limit surface Z1 to be removed by the first chemical mechanical polishing), for example, by polishing around 280 nm (in FIG. 2, an oxide film CMP process 210). On this occasion, regarding the composition of slurry, for example, 12% by weight of fumed silica abrasive grain, ammonia, a dispersant and the like are added to give pH of around 10.9.

Next, as shown in FIG. 9, on the silicon oxide film 5*b*, a silicon oxide film 5*c* is formed as a cap film in a thickness of around 100 nm by plasma CVD using TEOS (in FIG. 2, cap film formation process 216). The silicon oxide film 5*c* also constitutes, at this time, a part of the pre-metal interlayer insulating film 5. As the cap film, in addition to a silicon oxide film by plasma CVD using TEOS, a silicon oxide-based insulating film by other CVD or coating can be utilized.

Next, on the silicon oxide film 5*c*, resist film patterns for opening a contact hole is formed by usual lithography. Using the resist film patterns as a mask, a contact hole 12 is opened as shown in FIG. 10 by anisotropic dry etching using a mixed gas of, for example, such fluorocarbon gases as $CF_4$, $C_2F_6$, $C_4F_8$ and $C_5F_8$, oxygen gas, argon gas and the like, while utilizing the silicon nitride film 4 as an etch stop film. Subsequently, as shown in FIG. 11, the contact hole 12 is extended to the silicide layer 7 by removing the silicon nitride film 4 at the hole bottom by anisotropic dry etching using a mixed gas of, for example, such fluorocarbon gases as $CF_4$ and $CHF_3$, oxygen gas, argon gas and the like. After that, unnecessary resist film patterns are removed (in FIG. 2, a contact opening process 211).

Next, as shown in FIG. 12, on the upper surface of the silicon oxide film 5*c* and the inner surface of the contact hole 12, a titanium film and a titanium nitride film are sequentially formed as a barrier metal 11 by metal CVD treatment using, for example, $TiCl_4$ as a metal source gas (in FIG. 2, a barrier metal film formation process 212). Meanwhile, as the method of forming the barrier metal 11, in addition to the metal CVD treatment, such methods as sputtering deposition and the combination of the metal CVD treatment and the sputtering deposition can be applied, when there exists no problem on covering properties (the same in Section 3).

Next, as shown in FIGS. 13 and 14, on the barrier metal 11, a tungsten layer 3 is formed so as to bury tungsten into the contact hole 12 by a metal CVD treatment using, for example, $WF_6$ as a metal source gas (in FIG. 2, a tungsten film formation process 213). Next, by a metal CMP treatment (a second chemical mechanical polishing), the barrier metal 11 outside the contact hole 12 is removed, and, at the same time, the upper portion of the pre-metal interlayer insulating film 5 is removed as the extension of the metal CMP treatment (For example, to the lower limit surface Z2 to be removed by the second chemical mechanical polishing. Usually, the silicon oxide film 5*c* is removed approximately completely by the treatment. However, according to need, the silicon oxide film 5*c* may be remained. It is the same in Section 3.) (in FIG. 2, a tungsten CMP process 214). The slurry has such composition as 5% by weight of an alumina abrasive grain, to which $Fe(NO_3)_3$ and the like are added, and pH is around 4. This completes a tungsten plug 3 as shown in FIG. 14. Afterward, the process moves to the formation process of a first wiring layer M1 in Section 1.

3. Description of a Process Flow (Cobalt Silicide Process) According to the Method of Manufacturing a Semiconductor Integrated Circuit Device of Another Embodiment of the Present Application (Mainly from FIGS. 15 to 26)

Figure 15:
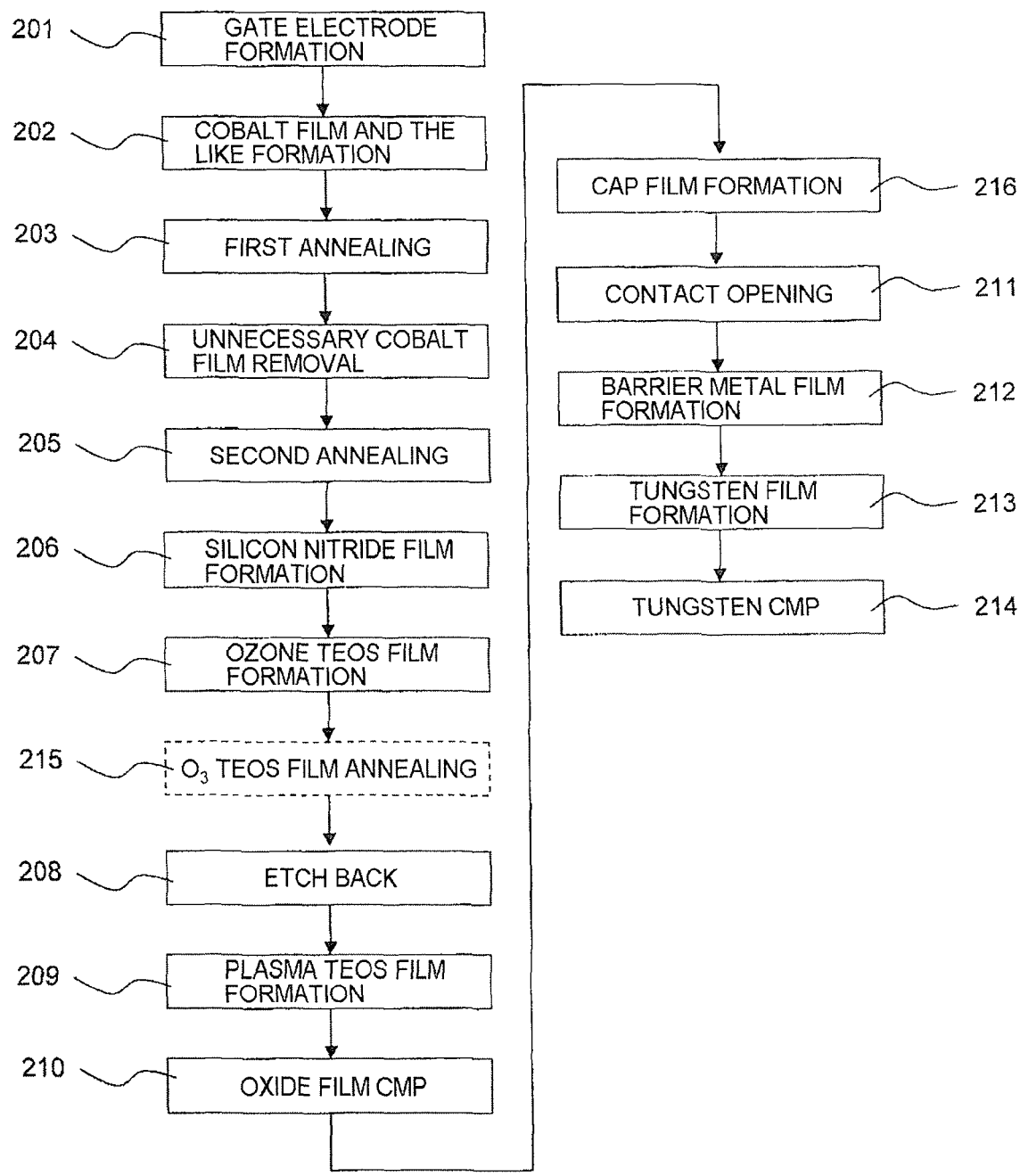
FIG. 15 is a process block flow diagram in the method of manufacturing a semiconductor integrated circuit device (cobalt silicide process) of another embodiment of the present invention.

FIG. 15 is a process block flow chart in a method of manufacturing a semiconductor integrated circuit device (cobalt silicide process) of another embodiment of the present invention. Meanwhile, in the description of the process flow (cobalt silicide process) according to the method of manufacturing a semiconductor integrated circuit device of another embodiment of the application, FIGS. 2 to 14 used in the description of the nickel silicide process are used as alternatives and description of overlapping portions are not repeated. Up to the formation of the N-type source/drain impurity region 6 and the like, the process is approximately the same as in Section 2, and description is not repeated.

As shown in FIGS. 15 and 3, the silicon oxide film of the upper surface 1*a* of the semiconductor substrate (wafer) is removed to expose the substrate upper surface 1*a*. In the state, a cobalt film and a titanium nitride film being a cap film are formed to the approximately whole surface by sputtering (in FIG. 15, a cobalt film and the like formation process 202). After that, the wafer upper surface 1*a* is subjected to an annealing treatment at a temperature of around 450° C. (in a non-oxidizing atmosphere) to allow the cobalt film to react with silicon at the portion of wafer upper surface 1*a* to form cobalt silicide (in FIG. 15, a first annealing process 203). After that, by wet etching (etching solution is, for example, a mixed solution of hydrochloric acid and hydrogen peroxide), an unreacted cobalt film and titanium nitride film are removed (in FIG. 15, an unnecessary cobalt film removal process 204). After that, again, the wafer upper surface 1*a* is subjected to an annealing treatment at a temperature of around 740° C. (in a non-oxidizing atmosphere) to advance the siliciding reaction (in FIG. 15, a second annealing process 205). This results in, as shown in FIG. 3, the formation of a silicide layer 7 (cobalt silicide layer 7*b*) on the N-type source/drain impurity region 6 (the same for the P-type source/drain impurity region) and the gate polysilicon film. This results in the formation of a gate structure 18 constituted of the gate oxide film 9, the gate polysilicon film 8, the sidewall spacer insulating film 10, the silicide layer 7 on the gate polysilicon and the like.

Next, processes in the silicon nitride film formation process 206 and the ozone TEOS film formation process 207 in FIG. 15 are performed. Since the processes are substantially the same as the process 206 and the process 207, respectively, in the above-described nickel silicide process, detailed description is omitted.

Next, the silicon oxide film 5*a* is subjected to an annealing treatment at a temperature of around 750° C. (for the purpose of improving the planarization by reflow and the film hardness) (in FIG. 15, an ozone TEOS annealing process 215). As the result of the treatment, the cobalt silicide process gives the silicon oxide film 5*a* (ozone TEOS film) having a slightly higher hardness as compared with the nickel silicide process. In contrast, in the case of the nickel silicide process, a heat treatment is possible at a temperature of around 550° C. at the highest from the restriction on the properties of nickel silicide, after forming the silicide. Therefore, the hardness of the silicon oxide film 5a (ozone TEOS film) cannot be improved by annealing.

Next, respective treatments of an etch back process 208, a plasma TEOS film formation process 209, an oxide film CMP process 210, a cap film formation process 216, a contact opening process 211, a barrier metal film formation process 212, a tungsten film formation process 213, and a tungsten CMP process 214, in FIG. 15, are performed. Since these overlaps with the processes 208-210, the process 216, the processes 211-214 of the nickel silicide process as described based on FIG. 2, detailed description is omitted here.

4. Detailed Description About Various Kinds of CVD Apparatuses, Film Properties and Pre-Metal Processes for Use in the Method of Manufacturing a Semiconductor Integrated Circuit Device of the Embodiment of the Application (Mainly FIGS. 16-18)

In this section, a description is given about the deposition apparatus, deposition process of a silicon oxide film (ozone TEOS film 5a, plasma TEOS film 5b, cap plasma TEOS film 5c) for use in the section 2 or 3 and properties of a film generated thereby.

Figure 16:
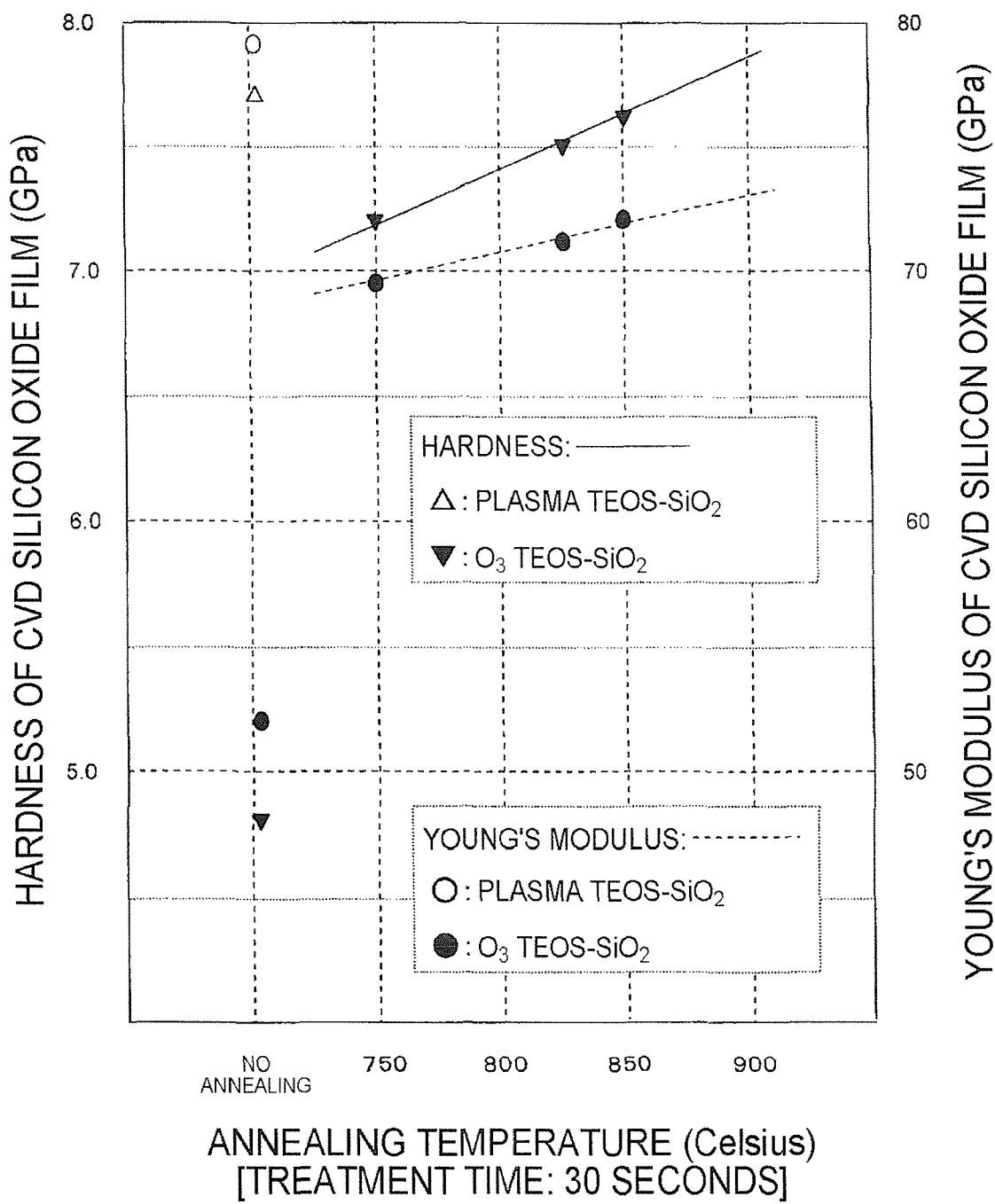
FIG. 16 is a data plot diagram showing hardness, Young's modulus, and the dependence thereof on annealing temperature for a CVD silicon oxide film.
Figure 17:
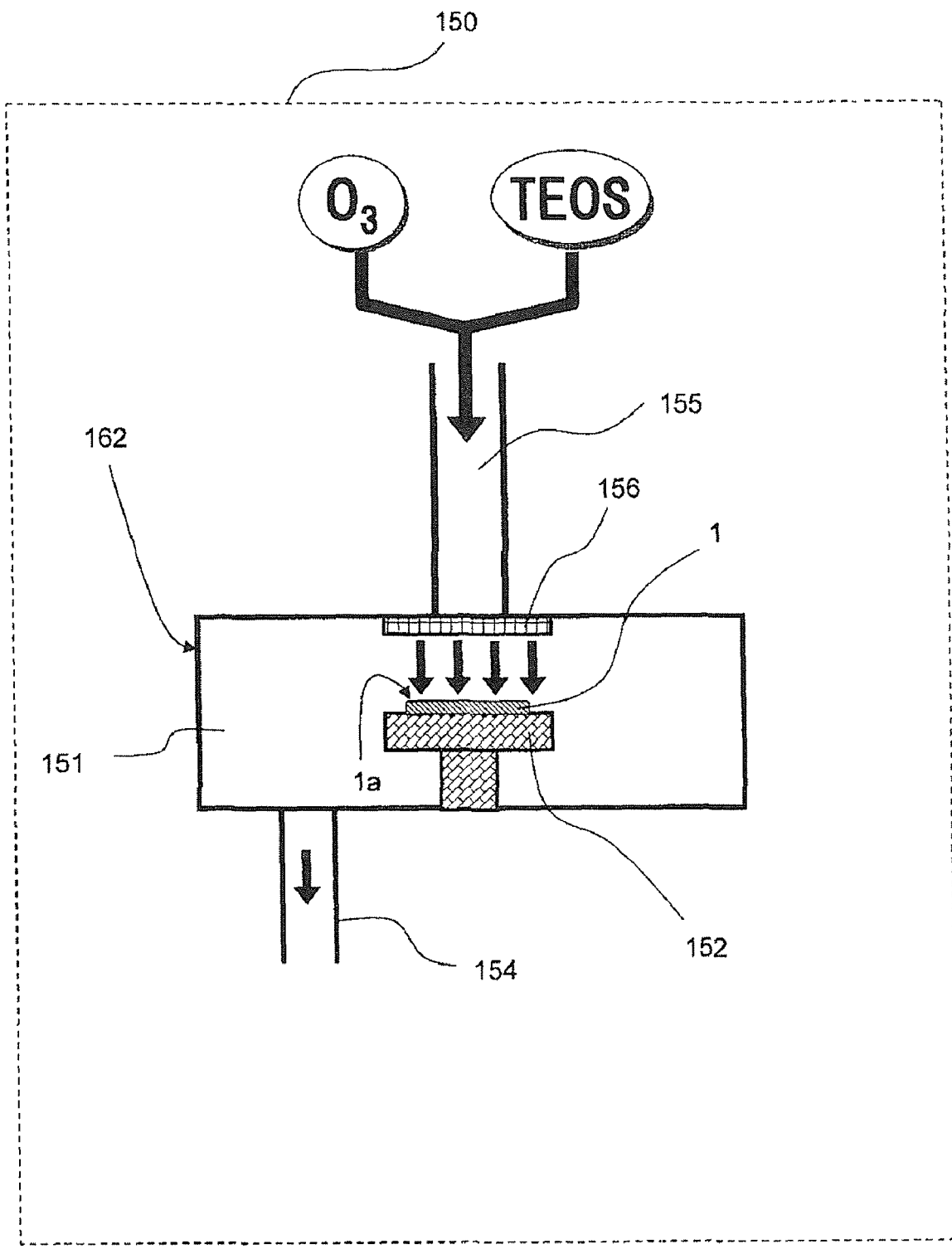
FIG. 17 is a schematic cross-sectional view of a sheet-feeding thermal CVD apparatus of a cold wall system using ozone and TEOS for use in the method of manufacturing a semiconductor integrated circuit device of the embodiment of the present invention.
Figure 18:
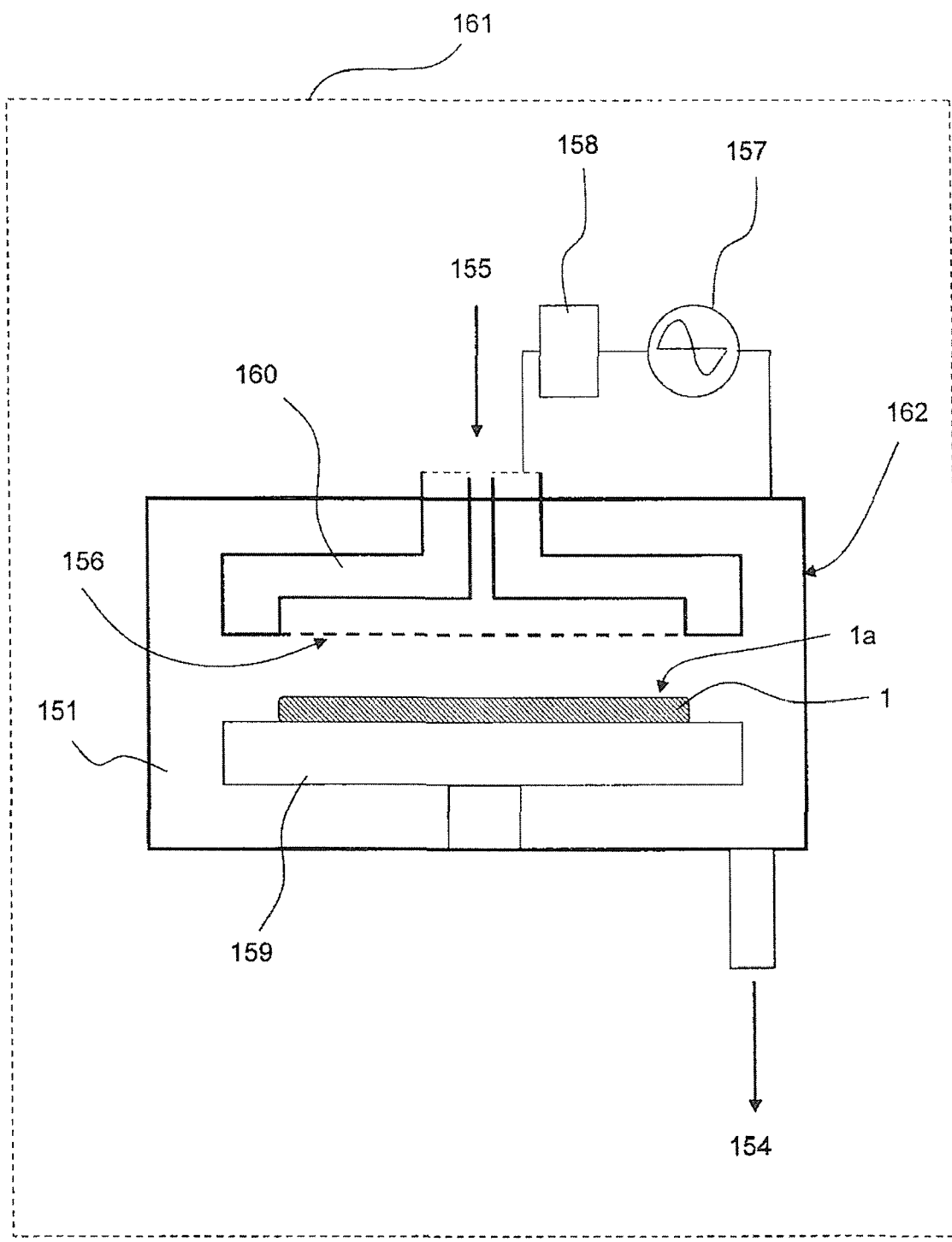
FIG. 18 is a schematic cross-sectional view of a sheet-feeding plasma CVD apparatus using TEOS for use in the method of manufacturing a semiconductor integrated circuit device of the embodiment of the present invention.

FIG. 16 is a data plot diagram showing the hardness, Young's modulus, and dependence thereof on annealing temperature for a CVD silicon oxide film. FIG. 17 is a schematic cross-sectional view of a sheet-feeding thermal CVD apparatus of a cold wall system using ozone and TEOS for use in the method of manufacturing a semiconductor integrated circuit device according to the embodiment of the present invention. FIG. 18 is a schematic cross-sectional view of a sheet-feeding plasma CVD apparatus using TEOS for use in the method of manufacturing a semiconductor integrated circuit device according to the embodiment of the present invention. On the basis of these, details about various kinds of CVD apparatuses, film properties and pre-metal processes for use in the method of manufacturing a semiconductor integrated circuit device according to the embodiment of the application are described.

Firstly, a quasi ordinary pressure deposition apparatus 150 (cold wall type sheet feeding apparatus) for forming the ozone TEOS film 5a is described. As shown in FIG. 17, the apparatus is a thermal CVD apparatus, and a chamber 151 has a wafer stage 152 for placing the wafer 1 to be treated, a shower head 156 and the like to constitute a sheet-feeding reaction furnace. The wafer 1 is set on the wafer stage 152 with the device surface 1a up. Heating is performed by a heating mechanism (resistance heating system) built in the wafer stage 152. The heating mechanism is set at around 400° C. to 550° C. (wafer treating temperature) at the treating of the wafer 1. On the other hand, a chamber wall 162 is cooled to a prescribed temperature. At the film formation, the inside of the chamber 151 is evacuated so as to give a degree of vacuum around from 2 KPa to 80 KPa. Helium gas (carrier gas) containing ozone and TEOS is introduced from a gas introducing pipe 155 and exhausted from a vacuum exhausting system 154.

Next, a deposition apparatus 161 (sheet-feeding plasma CVD apparatus) for forming the plasma TEOS silicon oxide film 5b (second silicon oxide film) and the cap plasma TEOS silicon oxide film (third silicon oxide film) is described. In the apparatus, as shown in FIG. 18, a lower electrode 159 (earth electrode) in the chamber 151 has a built-in heating mechanism, and also works as a wafer stage. On the other hand, an upper electrode 160 also works as a gas feeding mechanism with the gas feeding pipe 155 and the shower head 156. To the upper electrode 160, high-frequency power (13.56 MHz, 400 to 430 kHz) is supplied from the high-frequency power source 157 via a matching circuit 158. At the film formation, the wafer 1 to be treated is set on the lower electrode 159 with the device surface 1a up. The inside of the chamber 151 is maintained at a vacuum degree of around 300-1100 Pa at the film formation by the exhaust system 154. The temperature of a chamber wall 162 is maintained at a prescribed temperature. On the other hand, the wafer stage 159 is set to a temperature of around 370° C. to 400° C. (wafer treatment temperature) by a heating mechanism.

Next, mechanical properties of the ozone TEOS film 5a and the plasma TEOS film 5b formed with these apparatuses are described. As shown in FIG. 16, the ozone TEOS film 5a in a state where it is not annealed after the deposition has relatively low Young's modulus and hardness. However, when annealed at 750° C. or higher, it is rapidly hardened to result in showing relatively high Young's modulus and hardness.

On the other hand, as compared with the ozone TEOS film 5a after the annealing, the plasma TEOS film 5b in a state of no annealing after the deposition also shows equivalent or higher Young's modulus and hardness. This may be due to the excitation action of plasma to give a higher effective reaction temperature.

For the current pre-metal insulating film 5, a higher degree of gap fill properties are required due to the decrease in the pitch between the gate structures 18 and the increase in the aspect ratio. On the other hand, along with the miniaturization of patterns, in the cobalt silicide process, the reduction of the annealing temperature of the silicon oxide film is required, and, in the nickel silicide process, a treatment at a high temperature over 550° C. is difficult after the formation of silicide. Therefore, the omission of the annealing of the silicon oxide film becomes indispensable.

Here, according to the analysis result by the inventors of the application, it became clear that, when the ozone TEOS film 5a on the gate structure 18 becomes thin (the ozone TEOS film is formed at low temperatures to lead to a film of low hardness) in the state of FIG. 4, the stress concentrates on the interface between the plasma TEOS silicon oxide film 5b thereon and the ozone TEOS film 5a upon the occasion of CMP treatment to generate a crack. Then, the crack is once covered with the cap film 5c, but it is exposed again in the contact hole 12 at the time of opening the contact hole, into which the barrier metal 11 intrudes. As the result, a short-circuit defect is caused between adjacent contact holes 12.

In order to prevent this, the ozone TEOS film 5a may be subjected to a sufficient annealing treatment at a temperature of around 850° C. as shown in FIG. 16. However, the reduction of process temperature as described above is indispensable and a high temperature annealing treatment cannot be performed.

Therefore, after the state shown in FIG. 4, as shown in FIG. 5, it is so constituted as once etching back the ozone TEOS film 5a so as to expose the etch stop film 4 on the gate structure 18, and then forming the plasma TEOS silicon oxide film 5b that has a relatively high Young's modulus and hardness even in a state of no treatment after the deposition. Since the silicon nitride film 4 is a hard film originally, no stress concentrates on the interface between the silicon nitride film 4 and the plasma TEOS film 5b. Since the plasma TEOS film 5b has a high hardness, for a following CMP treatment, it shows a comparatively good scratch resistance.

It is also considered to use a silicon oxide film by HDP-CVD using such gas system as monosilane, in place of the ozone TEOS film 5a. However, although the silicon oxide film by HDP-CVD has a comparatively high Young's modulus and hardness in a state of no treatment after the deposition, the film has a high stress and sufficient attention is necessary for transistor properties. In this case, since Young's modulus and hardness are high to eliminate the anxiety for the generation of crack, it is also considered that the necessity for etch back is comparatively low. Further, when using a silicon oxide film by HDP-CVD, it may occasionally be effective to form both the ozone TEOS film 5a and the plasma TEOS film 5b in one step as a silicon oxide film by HDP-CVD, and, then, to subject the oxide film to a CMP treatment and use the plasma TEOS silicon oxide film or another CVD silicon oxide film as the cap film.

5. Other Embodiments

As other embodiments, embodiments shown in the following paragraphs (1) to (20) are also shown clearly.

(1) A method of manufacturing a semiconductor integrated circuit device comprises the steps of:

(a) forming a plurality of gate structures of MISFET including a polysilicon gate electrode over a first main surface of a semiconductor wafer;

(b) forming a source/drain region near both sides of respective gate structures of the first main surface of the semiconductor wafer;

(c) after the steps of (a) and (b), siliciding an upper surface of the source/drain region;

(d) forming an etch stop film over the first main surface of the semiconductor wafer including the silicided upper surface of the source/drain region;

(e) forming a pre-metal interlayer insulating film constituted of at least a first silicon oxide film and a second silicon oxide film over the etch stop film; and (f) performing a first chemical mechanical polishing treatment for the upper surface of the second silicon oxide film, wherein the step (e) further includes the steps of:

(e-1) forming the first silicon oxide film by thermal CVD at a temperature from 400° C. to 550° C., and (e-2) forming the second silicon oxide film by plasma CVD.

(2) In the method of manufacturing a semiconductor integrated circuit device according to the paragraph (1), no annealing treatment at a temperature over 550° C. is performed for the first silicon oxide film between the steps (e-1) and (e-2).

(3) In the method of manufacturing a semiconductor integrated circuit device according to the paragraph (1) or (2), the first silicon oxide film is formed by thermal CVD using ozone and TEOS in the step (e-1), and the second silicon oxide film is formed by plasma CVD using TEOS in the step (e-2).

Here, in the nickel silicide process, a heat treatment (anneal) at a temperature over 550° C. cannot be performed from the restriction on properties of the nickel silicide film, as described above. On the other hand, since an ozone TEOS film generated at 550° C. or lower has a low hardness, the polishing of the ozone TEOS film by CMP results in the occurrence of such problem as the generation of crack in the ozone TEOS film. In contrast, in the embodiments of the (1) to (3), a plasma TEOS film having high hardness is formed on the upper surface of an ozone TEOS film having low hardness, and then the plasma TEOS film is subjected to polishing treatment by CMP. Therefore, it becomes possible to form an interlayer insulating film in which the generation of crack and the like is suppressed.

(4) A semiconductor integrated circuit device comprises:

(a) a plurality of MISFET gate structures formed over a first main surface of a semiconductor wafer and including a polysilicon gate electrode;

(b) a source/drain region formed near the both sides of the gate structure of the first main surface of the semiconductor wafer;

(c) an etch stop film formed over the first main surface of the semiconductor wafer including the upper surface of the gate structure and the upper surface of the source/drain region;

(d) a first silicon oxide film that is a part of an interlayer insulating film buried between the respective gate structures and is formed by a thermal CVD method, the first silicon oxide film being formed so as to expose the etch stop film formed in the upper surface of the gate structure;

(e) a second silicon oxide film that is a part of the interlayer insulating film and is formed over the etch stop film formed over the first silicon oxide film and the upper surface of the gate structure, which is formed by a plasma CVD method; and (f) a connection hole in which a plug electrically connecting the source/drain region and a wiring formed over the interlayer insulating film is to be buried.

(5) In the semiconductor integrated circuit device according to the paragraph (4), an element isolation field insulating film having an STI structure is further formed over the first main surface of the semiconductor wafer, and the etch stop film is formed also including the upper surface of the element isolation field insulating film.

(6) In the semiconductor integrated circuit device according to the paragraph (4) or (5), the connection hole and the source/drain region are electrically connected via the silicide film.

(7) In the semiconductor integrated circuit device according to the paragraph (6), the silicide film is a nickel silicide film.

(8) In the semiconductor integrated circuit device according to the paragraph (6), the silicide film is a cobalt silicide film.

(9) In the semiconductor integrated circuit device according to any one of the paragraphs (4) to (8), the first silicon oxide film is a film formed by a thermal CVD method using ozone and TEOS at a temperature from 400 to 550° C.

(10) In the semiconductor integrated circuit device according to the paragraph (7), the first silicon oxide film is a film having not been subjected to an annealing treatment at a temperature over 550° C.

(11) In the semiconductor integrated circuit device according to any one of paragraphs (4) to (10), the hardness of the first silicon oxide film is lower than that of the second silicon oxide film.

Here, as described above, it became clear that, when the ozone TEOS film 5a (the first silicon oxide film formed by a thermal CVD method) on the gate structure 18 (gate structure) becomes thin in the state of FIG. 4 (the ozone TEOS film is formed at low temperatures to lead to a film of low hardness), the stress concentrates on the interface between the plasma TEOS silicon oxide film 5b thereon (the second silicon oxide film formed by a plasma CVD method) and the ozone TEOS film 5a upon the occasion of CMP treatment to generate a crack. Then, the crack is once covered with the cap film 5c, but it is exposed again in the contact hole 12 at the time of opening the contact hole 12, into which the barrier metal 11 constituting the plug intrudes. As the result, a short-circuit defect is caused between adjacent contact plugs.

Consequently, a structure, in which the etch stop film 4 is exposed by etching back the ozone TEOS film 5a (the first silicon oxide film formed by a thermal CVD method) on the gate structure 18 (gate structure), is adopted. Further, such a structure as stacking the plasma TEOS silicon oxide film 5b (the second silicon oxide film formed by a plasma CVD method) that has a relatively high Young's modulus and hardness even in a state of no treatment after the deposition is adopted. Since the foundation of the plasma TEOS film (the second silicon oxide film) at the upper portion of the gate structure constitutes a relatively hard etch stop film, the concentration of CMP stress can be avoided. That is, since the silicon nitride film 4 being the etch stop film is originally a hard film, no stress concentrates on the interface between the silicon nitride film 4 and the plasma TEOS film 5*b* (the second silicon oxide film). Meanwhile, since the plasma TEOS film 5*b* has high hardness, it also shows a comparatively good scratch resistance for a subsequent CMP treatment.

Consequently, by adopting the structure of the semiconductor integrated circuit device shown in the embodiments of (4)-(11), it is possible to suppress the generation of crack resulted from the stress concentration by CMP, and, further, to suppress the generation of a short-circuit defect in the contact hole 12 (connection hole).

(12) A semiconductor integrated circuit device comprises:
(a) a plurality of MISFET gate structures formed over a first main surface of a semiconductor wafer and including a polysilicon gate electrode;
(b) a source/drain region formed near both sides of the gate structure of the first main surface of the semiconductor wafer;
(c) a silicide film formed on the upper surface of the source/drain region;
(d) an etch stop film formed over the first main surface of the semiconductor wafer including the upper surface of the gate structure and the upper surface of the silicide film of the source/drain region;
(e) a first silicon oxide film that is a part of an interlayer insulating film buried between the respective gate structures and is formed so as not to cover the etch stop film formed in the upper surface of the gate structure;
(f) a second silicon oxide film that is a part of the interlayer insulating film and is formed over the first silicon oxide film and the etch stop film formed in the upper surface of the gate structure; and
(g) a connection hole in which a plug electrically connecting the silicide film formed in the upper surface of the source/drain region and a wiring formed over the interlayer insulating film is buried.

(13) In the semiconductor integrated circuit device according to the paragraph (12), the silicide film is a nickel silicide film.

(14) In the semiconductor integrated circuit device according to any one of the paragraphs (12) and (13), the first silicon oxide film is a film formed by a thermal CVD method at a temperature from 400 to 550° C. using ozone and TEOS.

(15) In the semiconductor integrated circuit device according to any one of the paragraphs (12) to (14), the first silicon oxide film is a film having not been subjected to an annealing treatment at a temperature over 550° C.

(16) In the semiconductor integrated circuit device according to any one of the paragraphs (12) to (15), the hardness of first silicon oxide film is lower than that of the second silicon oxide film.

(17) A semiconductor integrated circuit device comprises:
(a) a plurality of MISFET gate structures formed over a first main surface of a semiconductor wafer and including a polysilicon gate electrode;
(b) a source/drain region formed near the both sides of the gate structure of the first main surface of the semiconductor wafer;
(c) a silicide film formed in the upper surface of the source/drain region;
(d) an etch stop film formed over the first main surface of the semiconductor wafer including the upper surface of the gate structure and the upper surface of the silicide film;
(e) an interlayer insulating film that is constituted of at least a first silicon oxide film and a second silicon oxide film and is buried between the respective gate structures; and
(g) a connection hole in which a plug electrically connecting the silicide film formed in the upper surface of the source/drain region and a wiring formed over the interlayer insulating film is buried,
wherein the first silicon oxide film is formed so as not to cover the etch stop film formed in the upper surface of the gate structure;
wherein the second silicon oxide film is formed over the first silicon oxide film and the etch stop film formed in the upper surface of the gate structure; and
wherein the hardness of the first silicon oxide film is lower than that of the second silicon oxide film.

(18) In the semiconductor integrated circuit device according to the paragraph (17), the silicide film is a nickel silicide film.

(19) In the semiconductor integrated circuit device according to the paragraph (17) or (18), the first silicon oxide film is a film formed by a thermal CVD method at a temperature from 400 to 550° C. using ozone and TEOS.

(20) In the semiconductor integrated circuit device according to any one of the paragraphs (17) to (19), the first silicon oxide film is a film having not been subjected to an annealing treatment at a temperature over 550° C.

Here, as described above, it became clear that, when the ozone TEOS film 5*a* (the first silicon oxide film formed by a thermal CVD method) on the gate structure 18 (gate structure) becomes thin in the state of FIG. 4 (the ozone TEOS film is formed at low temperatures to lead to a film of low hardness), the stress concentrates on the interface between the plasma TEOS silicon oxide film 5*b* thereon (the second silicon oxide film formed by a plasma CVD method) and the ozone TEOS film 5*a* upon the occasion of CMP treatment to generate a crack. Then, the crack is once covered with the cap film 5*c*, but it is exposed again in the contact hole 12 at the time of opening the contact hole, into which the barrier metal 11 constituting the plug intrudes. As the result, a short-circuit defect is caused between adjacent contact plugs.

In order to prevent this, the ozone TEOS film 5*a* may be subjected to a sufficient annealing treatment at a temperature of around 850° C. However, the reduction of siliciding process temperature as described above is indispensable and a high temperature annealing treatment cannot be performed.

Consequently, a structure, in which the ozone TEOS film 5*a* (the first silicon oxide film formed by a thermal CVD method) on the gate structure 18 (gate structure) is etched back so that the first silicon oxide film does not cover the etch stop film 4, is adopted. Further, such a structure as stacking the plasma TEOS silicon oxide film 5*b* (the second silicon oxide film formed by a plasma CVD method) that has a relatively high Young's modulus and hardness even in a state of no treatment after the deposition is adopted. Since the foundation of the plasma TEOS film (the second silicon oxide film) at the upper portion of the gate structure constitutes a relatively hard etch stop film, the concentration of CMP stress can be avoided. That is, since the silicon nitride film 4 being the etch stop film is originally a hard film, no stress concentrates on the interface between the silicon nitride film 4 and the plasma TEOS film 5*b* (the second silicon oxide film). Meanwhile, since the plasma TEOS film 5*b* (the first silicon oxide film formed by a thermal CVD method) has higher hardness as compared with the ozone TEOS film 5*a* (the first silicon oxide film formed by a thermal CVD method), it also shows a comparatively good scratch resistance for a subsequent CMP treatment.

Consequently, by adopting the structure of the semiconductor integrated circuit device shown in the embodiments of (12)-(20), it is possible to suppress the generation of crack resulted from the stress concentration by CMP, and, further, to suppress the generation of a short-circuit defect in the contact hole 12 (connection hole).

Meanwhile, needless to say, embodiments shown in the above-described paragraphs (12) to (20) do not exclude other effects described in the specification, but they exert these effects synergistically.

6. Summary

Up to now, the present inventions completed by the present inventors are specifically described on the basis of embodiments. However, needless to say, the inventions are not limited to these, and are capable of being modified variously in the range that does not deviate from the gist thereof.

For example, in respective embodiments, regarding a back-end process, a constitution mainly having copper damascene wiring is described specifically. However, needless to say, the present invention is not limited to it, but can be applied to a constitution applying damascene wiring of silver and the like to the back-end process, and a constitution using aluminum-based wiring for the back-end process.

Further, in the above-described respective embodiments, regarding a CVD apparatus, a sheet-feeding apparatus is specifically described. However, needless to say, the present invention is not limited to it, but it can also be applied to processes using a batch system apparatus or a mini batch system apparatus.

Further, regarding an ozone TEOS-thermal CVD apparatus, a quasi ordinary pressure apparatus is specifically described. However, needless to say, a process using an ordinary pressure apparatus is also usable.

Furthermore, from the standpoint of doping an impurity, the ozone TEOS film or the plasma TEOS film may be a non-doped silicon oxide film or a silicon oxide-based insulating film to which phosphorous, boron or another impurity is added, in accordance with the necessity of the device design.

What is claimed is:

1. A method of manufacturing a semiconductor integrated circuit device comprising the steps of:
   (a) forming a plurality of gate structures of MISFET including a polysilicon gate electrode over a first main surface of a semiconductor wafer;
   (b) forming a source/drain region near both sides of respective gate structures of the first main surface of the semiconductor wafer;
   (c) after the steps of (a) and (b), siliciding an upper surface of the source/drain region;
   (d) forming an etch stop film over the first main surface of the semiconductor wafer including the silicided upper surface of the source/drain region;
   (e) forming a first silicon oxide film, which is a part of a pre-metal interlayer insulating film, by thermal CVD using ozone and TEOS over the etch stop film;
   (f) etching the first silicon oxide film to expose the etch stop film over the respective gate structures;
   (g) after the step (f), forming a second silicon oxide film, which is a part of the pre-metal interlayer insulating film, by plasma CVD using TEOS at a portion where the etch stop film is exposed and a portion where the first CVD silicon oxide film remains; and
   (h) performing a first chemical mechanical polishing treatment for the upper surface of the second silicon oxide film.

2. The method of manufacturing a semiconductor integrated circuit device according to claim 1, further comprising the step of:
   (i) after the step (h), forming a third silicon oxide film, which is a part of the pre-metal interlayer insulating film, over the second silicon oxide film.

3. The method of manufacturing a semiconductor integrated circuit device according to claim 1, further comprising the steps of:
   (j) after the step (h), opening a contact hole at the pre-metal interlayer insulating film by dry etching utilizing the etch stop film; and
   (k) after the step (j), removing the etch stop film at the bottom of the contact hole.

4. The method of manufacturing a semiconductor integrated circuit device according to claim 1, further comprising the steps of:
   (j) after the step (h), opening a contact hole at the pre-metal interlayer insulating film by dry etching utilizing the etch stop film;
   (k) after the step (j), removing the etch stop film at the bottom of the contact hole to extend the contact hole;
   (l) after the step (k), forming a barrier metal film at the inner surface of the contact hole and the upper surface of the pre-metal interlayer insulating film;
   (m) after the step (l), forming a metal member layer containing tungsten as a main component over the barrier metal film so as to fill the contact hole; and
   (n) after the step (m), performing a second chemical mechanical polishing treatment to remove the metal member layer and the barrier metal film outside the contact hole.

5. The method of manufacturing a semiconductor integrated circuit device according to claim 1, further comprising the steps of:
   (i) after the step (h), forming a third silicon oxide film, which is a part of the pre-metal interlayer insulating film, over the second silicon oxide film;
   (j) after the step (i), opening a contact hole at the pre-metal interlayer insulating film by dry etching utilizing the etch stop film;
   (k) after the step (j), removing the etch stop film at the bottom of the contact hole to extend the contact hole;
   (l) after the step (k), forming a barrier metal film at the inner surface of the contact hole and the upper surface of the pre-metal interlayer insulating film;
   (m) after the step (l), forming a metal member layer containing tungsten as a main component over the barrier metal film so as to fill the contact hole; and
   (n) after the step (m), performing a second chemical mechanical polishing treatment to remove the metal member layer and the barrier metal film outside the contact hole.

6. The method of manufacturing a semiconductor integrated circuit device according to claim 5,
   wherein the step (n) includes the steps of:
   (n1) performing the second chemical mechanical polishing treatment to remove the metal member layer and the barrier metal film outside the contact hole; and
   (n2) performing the second chemical mechanical polishing treatment to remove the third silicon oxide film.

7. The method of manufacturing a semiconductor integrated circuit device according to claim 1, wherein the method performs the steps (a) and (b) in tandem or partially in parallel.

8. The method of manufacturing a semiconductor integrated circuit device according to claim 1,
wherein the etch stop film is constituted of a silicon nitride film.

9. The method of manufacturing a semiconductor integrated circuit device according to claim 1,
wherein the step (c) is a siliciding step of nickel.

10. The method of manufacturing a semiconductor integrated circuit device according to claim 9,
wherein the method performs, after the step (e), the step (f) without performing an annealing treatment of the first silicon oxide film.

11. The method of manufacturing a semiconductor integrated circuit device according to claim 1,
wherein the step (c) is a siliciding step of cobalt or a siliciding step of low-order cobalt silicide to higher-order one.

12. The method of manufacturing a semiconductor integrated circuit device according to claim 11, further comprising the step of (o) after the step (e) and before the step (f), performing an annealing treatment on the first main surface side of the semiconductor wafer at a temperature from 700° C. to 750° C.

13. The method of manufacturing a semiconductor integrated circuit device according to claim 1,
wherein the thickness of the etch stop film at the completion of the film formation is thinner than that of the first silicon oxide film at the completion of the film formation.

14. The method of manufacturing a semiconductor integrated circuit device according to claim 1,
wherein the thickness of the first silicon oxide film at the completion of the film formation is thinner than that of the second silicon oxide film at the completion of the film formation.

15. The method of manufacturing a semiconductor integrated circuit device according to claim 1,
wherein the fracture toughness of the first silicon oxide film at the start of the step (h) is smaller than that of the second silicon oxide film at the start of the step (h).

16. The method of manufacturing a semiconductor integrated circuit device according to claim 1,
wherein the step (f) is performed by dry etching.

17. The method of manufacturing a semiconductor integrated circuit device according to claim 1,
wherein the step (f) is performed by wet etching.

18. The method of manufacturing a semiconductor integrated circuit device according to claim 1,
wherein the step (e) is performed by quasi ordinary pressure CVD.

19. The method of manufacturing a semiconductor integrated circuit device according to claim 1,
wherein the step (e) is performed in such a state that the wafer is placed on a wafer stage having a temperature set between 400° C. and 550° C.

20. The method of manufacturing a semiconductor integrated circuit device according to claim 4,
wherein the barrier metal film includes a film of a lower layer containing titanium as a main component and a film of an upper layer containing titanium nitride as a main component.

21. The method of manufacturing a semiconductor integrated circuit device according to claim 2,
wherein the third silicon oxide film is a silicon oxide film formed by plasma CVD using TEOS.

22. A method of manufacturing a semiconductor integrated circuit device comprising the steps of:
(a) forming a plurality of gate structures of MISFET including a polysilicon gate electrode over a first main surface of a semiconductor wafer;
(b) forming a source/drain region near both sides of respective gate structures of the first main surface of the semiconductor wafer;
(c) after the steps of (a) and (b), siliciding an upper surface of the source/drain region;
(d) forming an etch stop film over the first main surface of the semiconductor wafer including the silicided upper surface of the source/drain region;
(e) forming a pre-metal interlayer insulating film constituted of at least a first silicon oxide film and a second silicon oxide film over the etch stop film; and
(f) performing a first chemical mechanical polishing treatment for the upper surface of the second silicon oxide film,
wherein the step (e) further includes the steps of:
(e-1) forming the first silicon oxide film by thermal CVD at a temperature from 400° C. to 550° C., and
(e-2) forming the second silicon oxide film by plasma CVD.

23. The method of manufacturing a semiconductor integrated circuit device according to claim 22,
wherein no annealing treatment at a temperature over 550° C. is performed for the first silicon oxide film between the steps (e-1) and (e-2).

24. The method of manufacturing a semiconductor integrated circuit device according to claim 22,
wherein the step (e-1) forms the first silicon oxide film by thermal CVD using ozone and TEOS, and the step (e-2) forms the second silicon oxide film by plasma CVD using TEOS.

* * * * *